US010567683B2

(12) United States Patent
Guidash et al.

(10) Patent No.: US 10,567,683 B2
(45) Date of Patent: Feb. 18, 2020

(54) IMAGE SENSOR WITH DEPLETION-LEVEL PIXEL CHARGE TRANSFER CONTROL

(71) Applicant: Rambus Inc., Sunnyvale, CA (US)

(72) Inventors: Michael Guidash, Rochester, NY (US); John Ladd, Santa Clara, CA (US)

(73) Assignee: Rambus Inc., Sunnyvale, CA (US)

( * ) Notice: Subject to any disclaimer, the term of this patent is extended or adjusted under 35 U.S.C. 154(b) by 116 days.

(21) Appl. No.: 15/313,029

(22) PCT Filed: Jun. 3, 2015

(86) PCT No.: PCT/US2015/034079
§ 371 (c)(1),
(2) Date: Nov. 21, 2016

(87) PCT Pub. No.: WO2015/187884
PCT Pub. Date: Dec. 10, 2015

(65) Prior Publication Data
US 2017/0208272 A1    Jul. 20, 2017

Related U.S. Application Data

(60) Provisional application No. 62/008,789, filed on Jun. 6, 2014, provisional application No. 62/076,011, filed on Nov. 6, 2014.

(51) Int. Cl.
*H04N 5/357*   (2011.01)
*H01L 27/146*  (2006.01)
*H04N 5/363*   (2011.01)
*H04N 5/378*   (2011.01)

(52) U.S. Cl.
CPC ....... *H04N 5/3575* (2013.01); *H01L 27/1461* (2013.01); *H01L 27/1463* (2013.01); *H01L 27/14605* (2013.01); *H01L 27/14614* (2013.01); *H01L 27/14621* (2013.01); *H01L 27/14636* (2013.01); *H01L 27/14645* (2013.01); *H04N 5/363* (2013.01); *H04N 5/378* (2013.01)

(58) Field of Classification Search
None
See application file for complete search history.

(56) References Cited

U.S. PATENT DOCUMENTS 5,608,243 A   3/1997  Chi et al.
6,909,126 B1  6/2005  Janesick
(Continued)

OTHER PUBLICATIONS

ISR—Notification of Transmittal of the International Search Report and the Written Opinion of the International Searching Authority dated Oct. 27, 2015 re Intl. Appln. No. PCT/US2015/34079. 14 Pages.

(Continued)

*Primary Examiner* — Quan Pham
(74) *Attorney, Agent, or Firm* — Charles Shemwell

(57) ABSTRACT

A pixel circuit within an integrated-circuit image sensor includes a photodiode having a pinning layer of a first conductivity type, a floating diffusion node and a transfer gate disposed between the photodiode and the floating diffusion node. A first control input is coupled to the transfer gate, and a second control input is coupled to the pinning layer of the photodiode to enable the depletion potential of the photodiode to be raised and lowered.

20 Claims, 18 Drawing Sheets

(56) References Cited

U.S. PATENT DOCUMENTS

| | | | |
|---|---|---|---|
| 7,557,335 B2* | 7/2009 | Hong | H01L 27/14603 |
| | | | 250/208.1 |
| 7,768,047 B2 | 8/2010 | Mauritzson et al. | |
| 8,227,844 B2 | 7/2012 | Adkisson et al. | |
| 8,339,494 B1 | 12/2012 | McCarter et al. | |
| 8,487,350 B2 | 7/2013 | Nozaki et al. | |
| 9,202,902 B2* | 12/2015 | Kawahito | H01L 27/14825 |
| 2008/0011942 A1* | 1/2008 | Hong | H01L 27/14603 |
| | | | 250/214.1 |
| 2009/0042331 A1 | 2/2009 | Dosluogiu et al. | |
| 2009/0160987 A1* | 6/2009 | Bechtel | H04N 5/353 |
| | | | 348/302 |
| 2009/0294816 A1* | 12/2009 | Park | H01L 27/14603 |
| | | | 257/292 |
| 2011/0013064 A1* | 1/2011 | Lahav | H04N 5/335 |
| | | | 348/296 |
| 2011/0089311 A1 | 4/2011 | Venezia et al. | |
| 2011/0168873 A1 | 7/2011 | Ha | |
| 2011/0297816 A1 | 12/2011 | Ladd | |
| 2011/0312138 A1 | 12/2011 | Yedinak et al. | |
| 2012/0168609 A1 | 7/2012 | Krymski | |
| 2012/0199882 A1 | 8/2012 | Shin | |
| 2015/0021461 A1 | 1/2015 | Nishihara et al. | |
| 2015/0187923 A1* | 7/2015 | Kawahito | H01L 27/14825 |
| | | | 257/223 |

OTHER PUBLICATIONS

Notification Concerning Transmittal of International Preliminary Report on Patentability dated Dec. 15, 2016 re: Int'l Appln. No. PCT/US15/034079. 8 Pages.

* cited by examiner

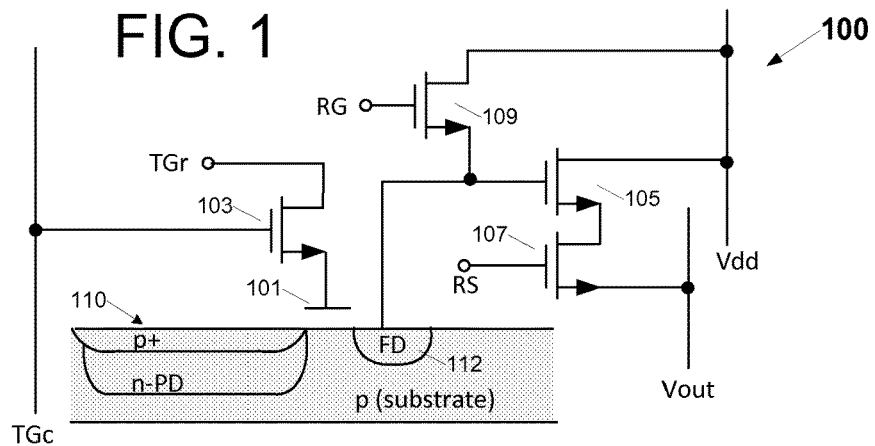
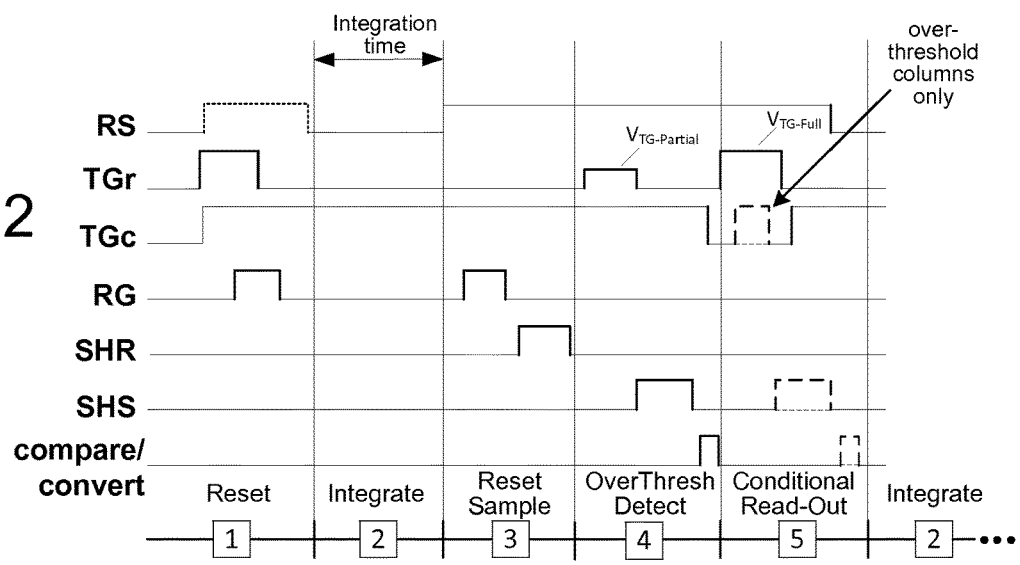
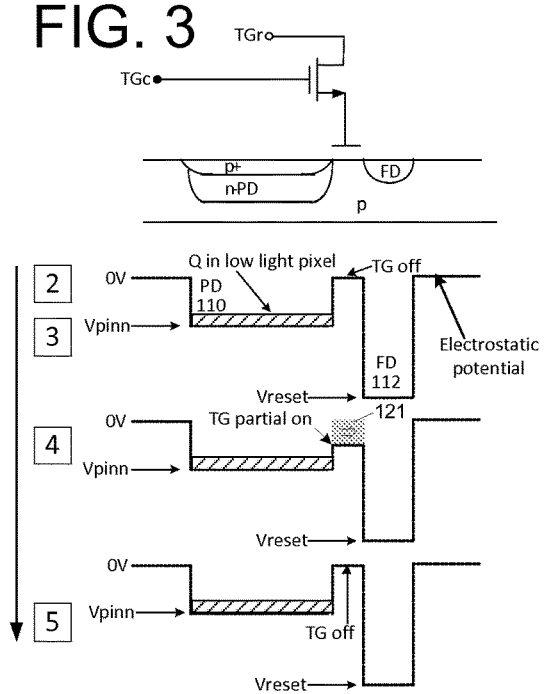
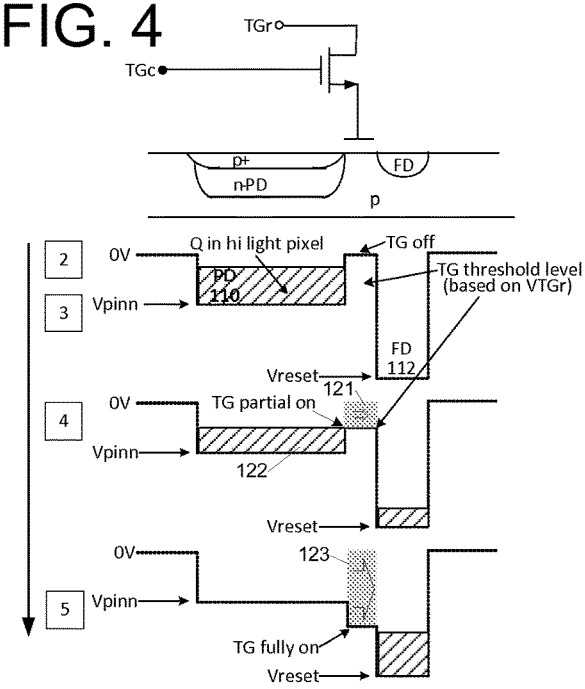

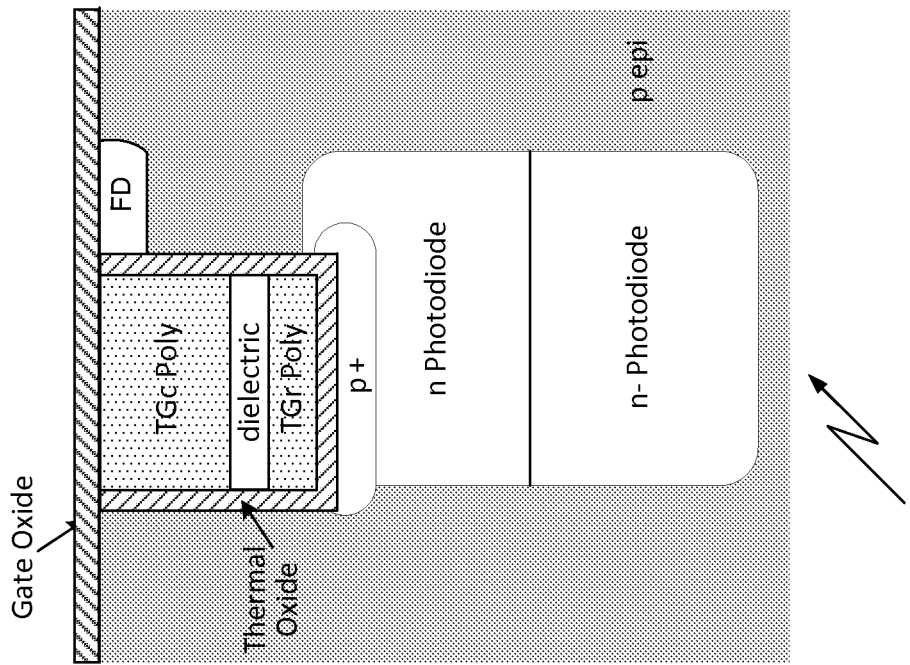
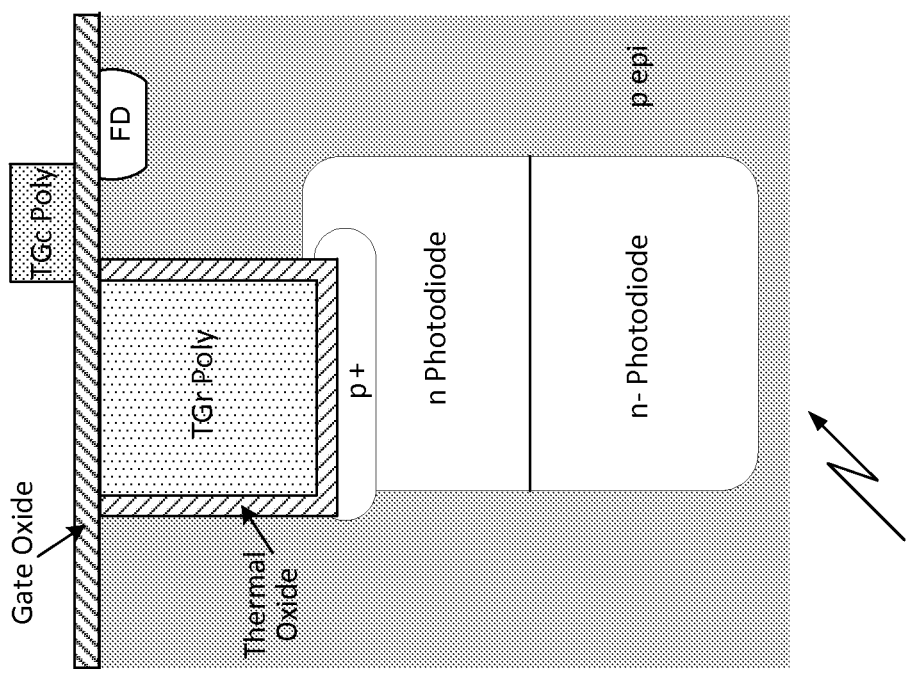

FIG. 16

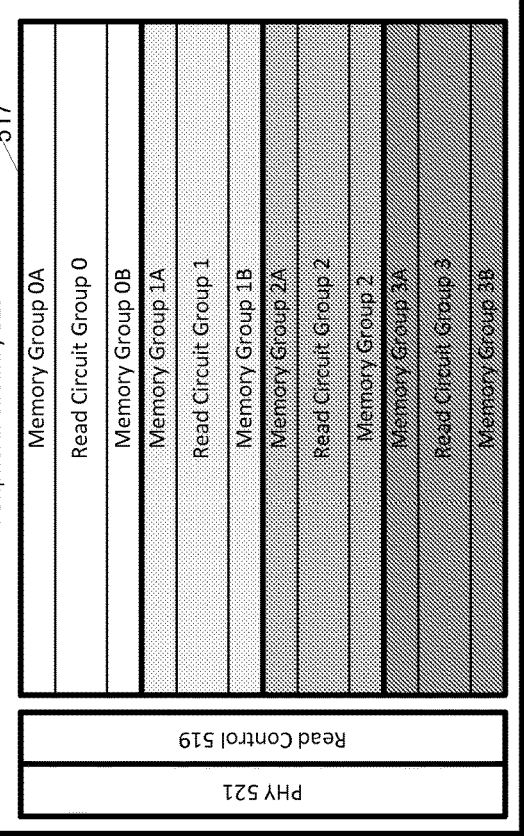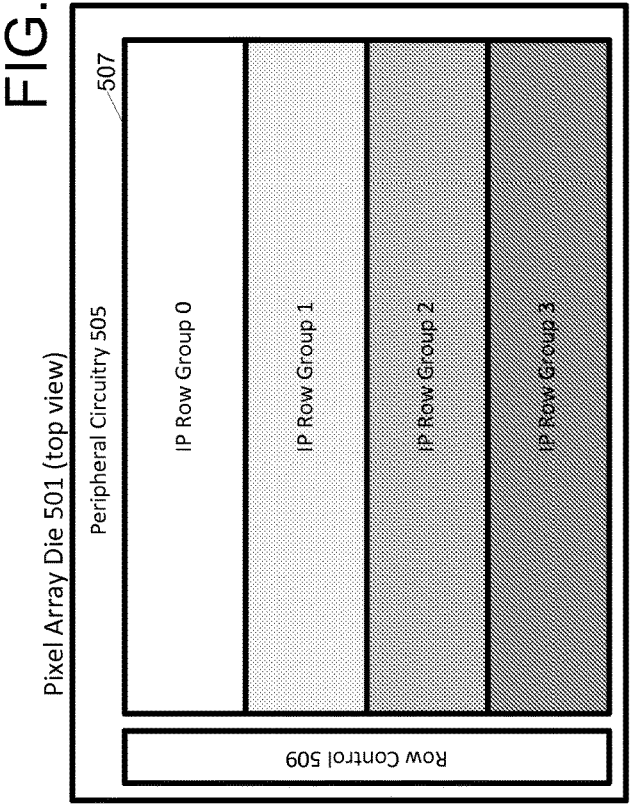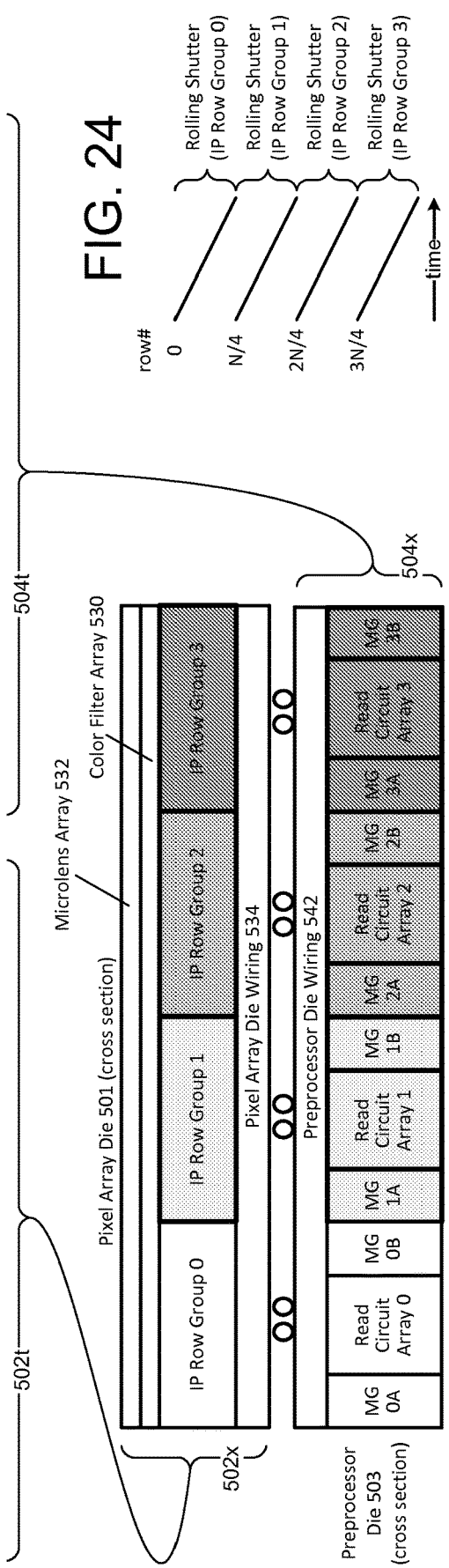

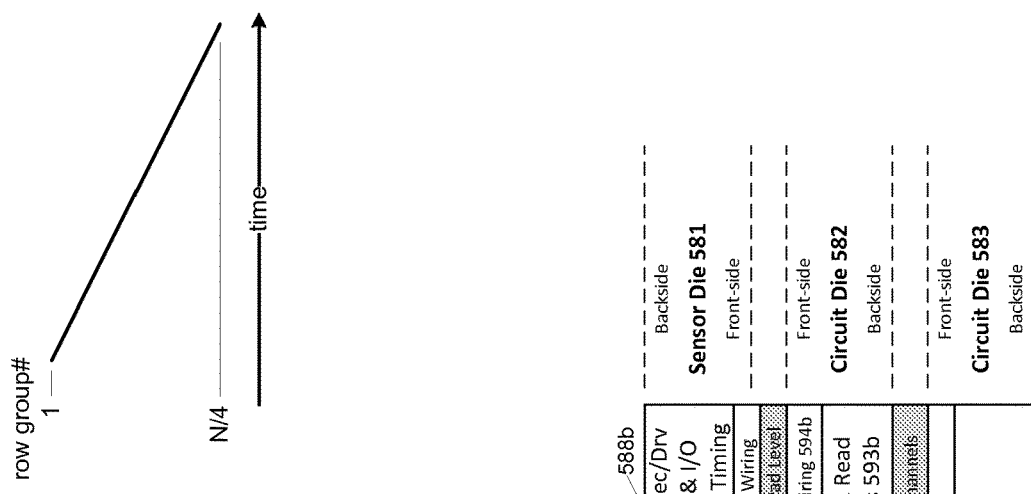
FIG. 26
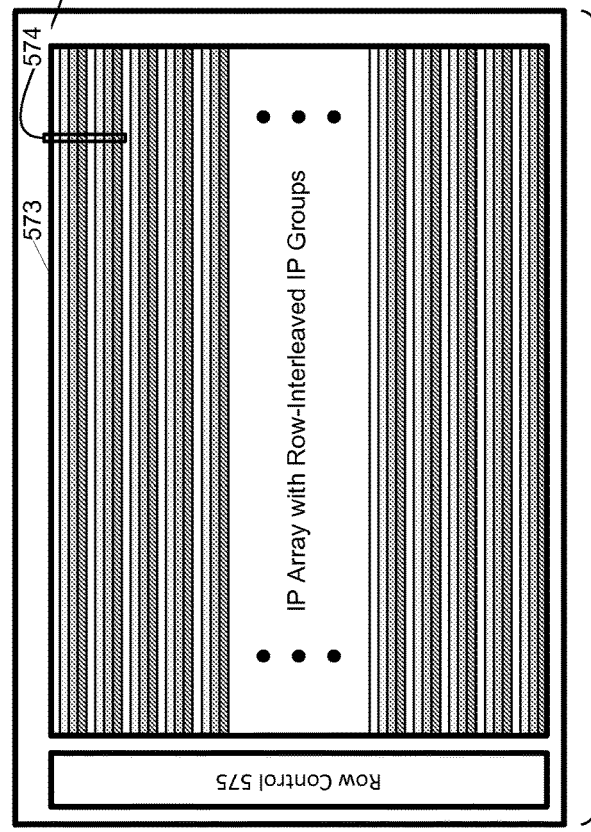
FIG. 25
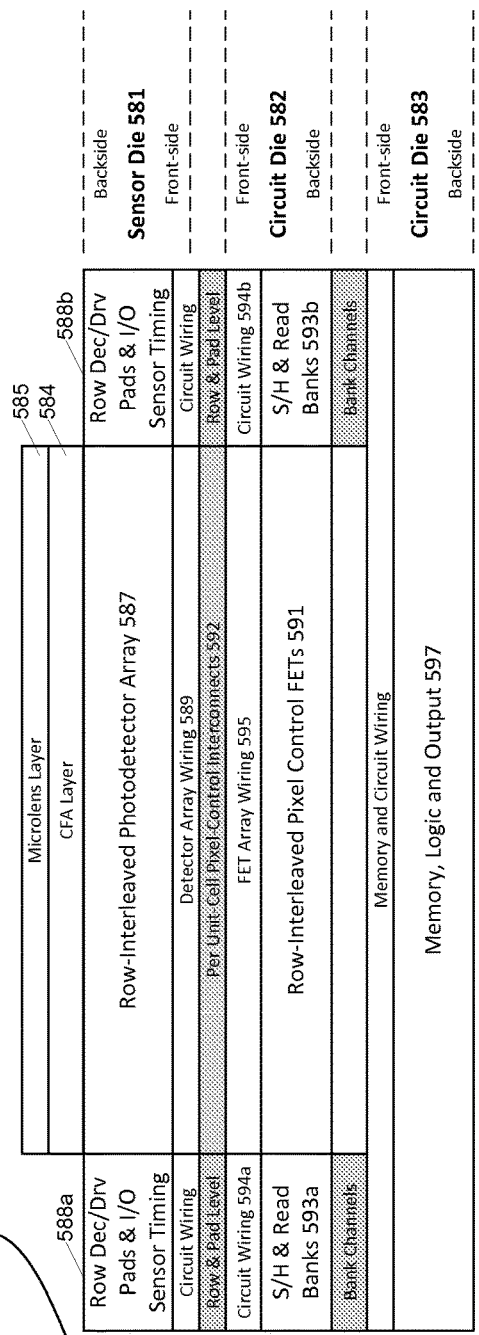

IMAGE SENSOR WITH DEPLETION-LEVEL PIXEL CHARGE TRANSFER CONTROL

CROSS-REFERENCE TO RELATED APPLICATIONS

This application hereby claims the benefit of and incorporates by reference the following U.S. Provisional Patent Applications:

| Application Ser. No. | Filing Date | Title |
| --- | --- | --- |
| 62/008,789 | Jun. 6, 2014 | IMAGE SENSOR WITH DEPLETION-LEVEL PIXEL CHARGE TRANSFER CONTROL |
| 62/076,011 | Nov. 6, 2014 | IMAGE SENSOR READOUT WITH TRANSFER-GATE NULLING |

TECHNICAL FIELD

The present disclosure relates to the field of integrated-circuit image sensors.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a modified 4-transistor pixel in which a non-destructive overthreshold detection operation is executed to enable conditional-read operation in conjunction with correlated double sampling;

FIG. 2 is a timing diagram illustrating an exemplary pixel cycle within the progressive read-out pixel of FIG. 1;

FIGS. 3 and 4 illustrate exemplary electrostatic potential diagrams for the photodiode, transfer gate and floating diffusion of FIG. 1 below their corresponding schematic cross-section diagrams;

FIGS. 10A and 10B illustrate embodiments of pixel architectures in which the entrenched poly-gate arrangements of FIG. 9 are formed above photodiode layers;

FIG. 16 illustrates relative electrostatic states of the photodiode, transfer gate and floating diffusion during the charge-integration and read-out phases of pixel operation, contrasting pixels having conditionally-enabled transfer gates with read-out masking pixels having conditionally-shifted photodiode depletion potentials;

FIG. 23 illustrates an exemplary two-die implementation of an image sensor in which a pixel array die is stacked on a "preprocessor" die;

FIG. 24 illustrates an exemplary readout profile within the image sensor of FIG. 23, demonstrating a readout parallelism achieved by provision of a separate readout circuit for each IP row group;

FIG. 25 illustrates an embodiment of an image sensor having row-interleaved groups of image pixels;

FIG. 26 illustrates an exemplary rolling-shutter readout profile corresponding to the row-interleaved image pixel groups shown in FIG. 25.

DETAILED DESCRIPTION

Figure 5:
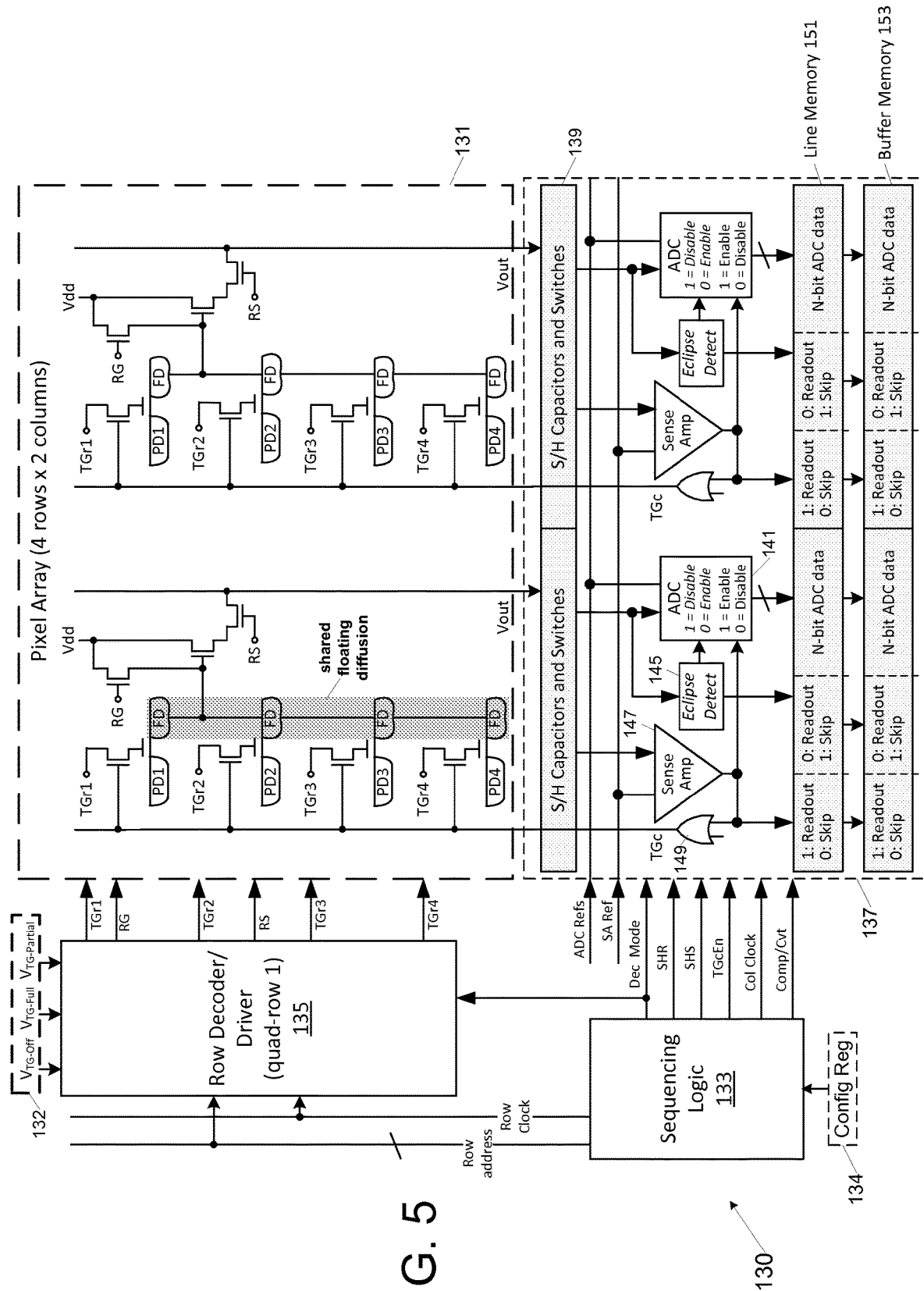
FIG. 5 illustrates a more detailed embodiment of an image sensor having an array of 4×1 quad pixel blocks operable in both full-resolution and reduced-resolution (binned) read-out modes.

High-SNR Image Sensor with Non-Destructive Threshold Monitoring

While three-transistor (3T) pixel architectures are suitable for many imaging applications, four-transistor (4T) designs having a "transfer gate" disposed between the photodiode and source-follower amplifier provide a number of advantages. First, a floating diffusion node used to temporarily hold the charge state of the photodiode during read out is disposed between the transfer gate and source follower and thus may be reset (e.g., coupled to $V_{DD}$ while the transfer gate is switched off) without disturbing the charge state of the photodiode, thereby enabling a correlated double-sampling (CDS) operation in which the kTC noise influenced reset level of the floating diffusion is sampled prior to charge transfer and then subtracted from the subsequent sampling of the photodiode potential, canceling the noise and significantly improving the SNR. Another advantage is, counter-intuitively, a more compact pixel design as the switched connection between the photodiode and source follower (i.e., via the transfer gate) enables the source follower, reset and access transistors to be shared among multiple photodiodes. For example, only seven transistors are required to implement a set of four "4T" pixels having a shared source follower, reset transistor and access transistor (i.e., four transfer-gates plus the three shared transistors), thus effecting an average of 1.75 transistors per pixel (1.75T).

In terms of pixel read-out, the direct connection between photodiode and source follower in a 3T pixel permits the charge state of the photodiode to be read-out without disturbing ongoing photocharge integration. This "non-destructive read" capability is particularly advantageous in the context of a temporally oversampled image sensor as the 3T pixel may be sampled and conditionally reset at multiple points in time within a frame period. That is, in each of a plurality of subframe intervals, the pixel may be read and then either reset to an initial state or permitted to continue integrating charge depending on whether the sampled charge level exceeds a predetermined threshold. Unfortunately, despite its higher SNR and potentially more compact implementation, the charge transfer between photodiode and floating diffusion as part of a 4T pixel readout disrupts the state of the photodiode, presenting a challenge for conditional-reset or conditional-read operation.

In a number of embodiments described below in connection with FIGS. 1-4, a modified 4T pixel architecture is operated in a manner that enables a non-destructive charge-accumulation assessment, followed by a correlated double sampling (CDS) read-out if the assessment indicates a threshold level of charge accumulation has been reached. That is, instead of reading out the net level of charge accumulated within the photodiode (i.e., a pixel sampling operation) and conditionally resetting the photodiode based on that read-out (i.e., as in a 3T pixel sampling operation), a preliminary overthreshold sampling operation is executed to enable detection of an overthreshold state within the photodiode, with the full photodiode read-out (i.e., pixel sample generation) being conditionally executed according to the preliminary overthreshold detection result. In effect, instead of conditionally resetting the photodiode according to the pixel value obtained from full photodiode readout, full photodiode readout is conditioned on the result of a preliminary, non-destructive determination of whether the threshold has been exceeded; an approach enabled, in at least one embodiment, by dissociating the conditional-read threshold (i.e., used to assess the level of integrated charge) from the pixel value generation.

FIG. 1 illustrates an embodiment of a modified 4T pixel 100, referred to herein as a "conditional-read pixel," in which a non-destructive overthreshold detection operation is executed to enable conditional-read/reset operation in conjunction with correlated double sampling. As explained more fully below, the overthreshold detection involves a limited read-out of the photodiode state which, when determined to indicate an overthreshold condition, will trigger a complete read-out of the photodiode state. That is, pixel 100 is read-out in a progression from a limited overthreshold detection read-out to a complete read-out (the latter being conditional according to the overthreshold detection result).

Still referring to FIG. 1, conditional-read pixel 100 includes a transfer gate 101 disposed between a photodiode 110 (or any other practicable photosensitive element) and floating diffusion node 112, and a transfer-enable transistor 103 coupled between a transfer-gate row line (TGr) and transfer gate 101. The gate of transfer-enable transistor 103 is coupled to a transfer-gate column line (TGc) so that, when TGc is activated, the potential on TGr is applied (minus any transistor threshold) via transfer-enable transistor 103 to the gate of transfer-gate 101, thus enabling charge accumulated within photodiode 110 to be transferred to floating diffusion 112 and sensed by the pixel readout circuitry. More specifically, floating diffusion 112 is coupled to the gate of source follower 105 (an amplification and/or charge-to-voltage conversion element), which is itself coupled between a supply rail ($V_{DD}$ in this example) and a read-out line, Vout, to enable a signal representative of the floating diffusion potential to be output to read-out circuits outside of the pixel.

As shown, a row-select transistor 107 is coupled between the source follower 105 and the read-out line (Vout) to enable multiplexed access to the read-out line by respective rows of pixels. That is, row-select lines ("RS") are coupled to the control inputs of row-select transistors 107 within respective rows of pixels and operated on a one-hot basis to select one row of pixels for sense/read-out operations at a time. A reset transistor 109 is also provided within the pixel to enable the floating diffusion to be switchably coupled to the supply rail (i.e., when a reset-gate line (RG) is activated) and thus reset. The photodiode itself may be reset along with the floating diffusion by fully switching on transfer gate 101 (e.g., by asserting TGc while TGr is high) and reset transistor 109 concurrently, or by merely connecting the photodiode to a reset-state floating diffusion.

FIG. 2 is a timing diagram illustrating an exemplary pixel cycle within the conditional-read pixel of FIG. 1. As shown, the pixel cycle is split into five intervals or phases corresponding to distinct operations executed to conditionally read out or refrain from reading out the pixel state. In the first phase (phase 1), a reset operation is executed within the photodiode and floating diffusion by concurrently asserting the appropriate logic high signals on the TGr, TGc and RG lines to switch on transfer-enable transistor 103, transfer gate 101 and reset transistor 109, thereby switchably coupling photodiode 110 to the supply rail via transfer gate 101, floating diffusion 112 and reset transistor 109 (the illustrated sequence can begin with an unconditional reset (e.g., at the start of a frame), and can also begin from a preceding conditional read-out/reset operation). To conclude the reset operation, the TGr and RG signals (i.e., signals applied on like-named signal lines) are lowered to appropriate "off" levels, thereby switching off transfer gate 101 (and reset transistor 109) so that the photodiode is enabled to accumulate (or integrate) charge in response to incident light in the ensuing integration phase (phase 2). Lastly, although the row-select signal goes high during the reset operation shown in FIG. 11, this is merely a consequence of an implementation-specific row decoder that raises the row-select signal whenever a given row address is decoded in connection with a row-specific operation (e.g., raising the TGr and RG signals during reset directed to a given row). In an alternative embodiment, the row decoder may include logic to suppress assertion of the row-select signal during reset as indicated by the dashed RS pulse in FIG. 2.

At the conclusion of the integration phase, the floating diffusion is reset (i.e., by pulsing the RG signal to couple the floating diffusion to the supply rail) and then sampled by a sample-and-hold element within the column read-out circuit. The reset and sample operation (shown as phase 3 in FIG. 2), in effect, samples the reset level of the floating diffusion and is executed in the embodiment of FIGS. 1 and 2 by asserting the row-select signal (RS) for the pixel row of interest while pulsing a reset-state sample-and-hold signal (SHR) to convey the state of the floating diffusion to the sample-and-hold element (e.g., a switch-accessed capacitive element) within the column read-out circuit via read-out line, Vout.

After acquiring the reset sample in phase 3, an overthreshold detection operation is executed in phase 4 by raising the TGr line to a partially-on, "overthreshold-detection" potential, $V_{TG\text{-}Partial}$, while transfer-enable transistor 103 is on (i.e., by asserting a logic high TGc signal,). By this operation, illustrated graphically in FIGS. 3 and 4, $V_{TG\text{-}Partial}$ is applied to transfer gate 101 to switch the transfer gate to a "partial on" state ("TG partial on"). Referring to FIGS. 3 and 4, electrostatic potential diagrams for photodiode 110 (a pinned photodiode in this example), transfer gate 101 and floating diffusion 112 are shown below their corresponding schematic cross-section diagrams. Note that the depicted levels of electrostatic potential are not intended to be an accurate representation of the levels produced in an actual or simulated device, but rather a general (or conceptual) representation to illustrate the operation of the pixel read-out phases. Upon application of $V_{TG\text{-}Partial}$ to transfer gate 101, a relatively shallow channel potential 121 is formed between photodiode 110 and floating diffusion 112.

In the example of FIG. 3, the level of charge accumulated within the photodiode at the time of the overthreshold detection operation (phase 4) does not rise to the threshold level required for charge to spill over (i.e., be transferred) to the floating diffusion via the shallow channel potential of the partially-on transfer gate. Accordingly, because the accumulated charge level does not exceed the transfer threshold (or spillover threshold) established by application of $V_{TG\text{-}Partial}$ to the control node of transfer gate 101, there is no charge transfer from the photodiode to the floating diffusion and the accumulated charge instead remains undisturbed within the photodiode. By contrast, in the example of FIG. 4, the higher level of accumulated charge does exceed the transfer threshold so that a portion of the accumulated charge (i.e., that subset of charge carriers that are above the transfer gate partially-on electrostatic potential) spills over into floating diffusion node 112, with the residual accumulated charge remaining within the photodiode as shown at 122.

Still referring to FIGS. 2, 3 and 4, prior to conclusion of overthreshold detection phase 4, the charge level of the floating diffusion is sampled and held within a signal-state sample-and-hold element (i.e., in response to assertion of signal SHS) to yield a threshold-test sample—the difference between the signal-state sample and the previously obtained reset-state sample—to be evaluated with respect to a conditional-reset threshold. In one embodiment, the conditional-reset threshold is an analog threshold (e.g., to be compared with the threshold-test sample in a sense amplifier in response to assertion of a compare/convert strobe signal) set or programmed to a setting above the sampling noise floor, but low enough to enable detection of minute charge spillover via the shallow transfer gate channel. Alternatively, the threshold-test sample may be digitized in response to assertion of the compare/convert signal (e.g., within an analog-to-digital converter that is also used to generate the finalized pixel sample value) and then compared with a digital conditional-reset threshold, again, set (or programmed to a setting) above the noise floor, but low enough to enable detection of trace charge spillover. In either case, if the threshold-test sample indicates that no detectable spillover occurred (i.e., threshold-test sample value is less than conditional-reset spillover threshold), then the photodiode is deemed to be in the underthreshold state shown in FIG. 3 and the TGc line is held low in the ensuing conditional read-out phase (phase 5, the final phase) to disable transfer gate 101 for the remainder of the conditional read-out operation—in effect, disabling further read-out from the photodiode and thus enabling the photodiode to continue integrating charge without disruption for at least another sampling interval. By contrast, if the threshold-test sample indicates a spillover event (i.e., threshold-test sample greater than conditional-reset/transfer threshold), then the TGc line is pulsed high, (or alternately remains high) during the conditional read-out phase concurrently with application of a fully-on, "remainder-transfer" potential, $V_{TG\text{-}Full}$, to the TGr line, thereby enabling the remainder of the charge (i.e., charge 122 as shown in FIG. 4) within photodiode 110 to be transferred to floating diffusion 112 via the full-depth transfer-gate channel (123) so that, between the overthreshold transfer in phase 4 and the remainder transfer in phase 5, the charge accumulated within the photodiode since the hard reset in phase 1 is fully transferred to the floating diffusion where it may be sensed in a pixel read-out operation. In the embodiment shown, the pixel-readout operation is effected by pulsing the SHS signal and compare/convert strobe in sequence during conditional read-out phase 5, though either or both of those pulses may optionally be suppressed in absence of an overthreshold detection. Note that conditional read-out of the photodiode (i.e., effected by asserting TGc in conjunction with application of $V_{TG\text{-}Full}$ on TGr) effectively resets the photodiode (i.e., drawing off all charge to the floating diffusion), while suppression of the conditional read-out leaves the integration state of the photodiode undisturbed. Accordingly, execution of the conditional read-out operation in phase 5 conditionally resets the photodiode in preparation for integration anew in the succeeding sampling interval (subframe) or refrains from resetting the photodiode to enable cumulative integration in the subsequent sampling interval. Thus, in either case, a new integration phase follows phase 5, with phases 2-5 being repeated for each subframe of the overall frame (or exposure) interval, before repeating the hard reset in a new frame. In other embodiments, where cumulative integration is permitted across frame boundaries, the hard reset operation may be executed to initialize the image sensor and omitted for an indeterminate period of time thereafter. Also, instead of the hard reset operation shown in phase 1, an unconditional read/reset may be effected following the final subframe of a frame interval or, if desired, in any non-final subframe by unconditionally asserting TGc during read-out phase 5 (i.e., asserting TGc in phase 5 without regard to the result of the overthreshold detection in phase 4.

FIG. 5 illustrates a more detailed embodiment of an image sensor 130 having an array of 4×1 quad conditional-read pixel blocks 131 that may be read out with full or reduced spatial resolution. As shown, a row decoder/driver 135 receives transfer gate voltages (e.g., $V_{TG\text{-}Partial}$, $V_{TG\text{-}Full}$ and $V_{TG\text{-}OFF}$) from an on-chip or off-chip voltage source 132 and a row address value and row clock (used to control row signal timing) from sequencing logic 133, outputting row control signals, RG, RS and TGr1-TGr4 in response. Sequencing logic additionally outputs a set of read-out control signals to column read-out circuitry 137, including a column clock signal (which may be composed of multiple timing/control signals for timing operations within the sense amplifiers 147, ADCs 141, memory buffers 151 and 153, etc. with column read-out circuitry 137), compare-strobe and convert-strobe signals as described above, the column transfer-gate enable signal (TGcEn), SHR and SHS signals (which may include separate signals for sense amp and ADC sample-and-hold elements).

Sequencing logic 133 also outputs a decimation-mode signal ("Dec Mode") to both column read-out circuitry 137 and row decoder/driver 135 to enable/disable charge and voltage binning operations within selected groups of pixels and thus select between reduced and full resolution readout. For example, in one embodiment, the decimation mode signal is configurable in one of at least two possible states (e.g., according to a decimation mode setting within a programmable configuration register 134), including a binning-disabled state in which pixel rows and columns are operated individually to enable full-resolution image read-out, and a bin-enable state in which the row decoder/driver asserts row signal pairs (e.g., TGr1/TGr3 and then TGr2/TGr4) in locked-step to achieve charge binning within the shared floating diffusion, and in which column read-out lines (Vout) for even and odd column pairs are transversely coupled by switching elements within capacitor and switch banks 139 to enable voltage binning within sample-and-hold elements.

Still referring to the embodiment of FIG. 5, column read-out circuitry 137 includes, in addition to sense amplifiers 147 and TGc logic gates 149 (which operate generally as described above), a set of column eclipse detect circuits 145, each coupled to receive a pixel reset signal from sample-and-hold block 139, and having circuitry to determine whether the photodiode measurement (whether binned or at full resolution) exceeds a saturation threshold. If a given eclipse-detector 145 (e.g., implemented by a threshold comparator) detects a saturation condition (i.e., saturation threshold exceeded) or eclipse condition, the eclipse detector raises an eclipse signal at a secondary enable input of ADC circuit 141 to disable ADC operation therein. The eclipse signal is also output to line memory element 151 to qualify the ADC output, being recorded within line memory 151 (and buffer memory 153) as a logic '1' eclipse bit if a saturation condition was detected (thus indicating that the ADC output is invalid and in fact should be represented by a maximum read-out value) and a logic '0' eclipse bit otherwise. By this operation, the eclipse bit and underthreshold bit (i.e., output of sense amplifier 147) recorded for each pixel column serve jointly to qualify the corresponding ADC output as follows (where 'X' indicates a don't care status):

TABLE 1

| Under-threshold | Eclipse | ADC Value | Interpretation |
|---|---|---|---|
| 0 | 0 | Invalid | Underthreshold: ADC output assumed to be 0 |
| X | 1 | Invalid | Saturation:, ADC output assumed to be all '1's |
| 1 | 0 | Valid | Overthreshold without Saturating |

Still referring to FIG. 5, when the binning mode is set to enable voltage binning between column pairs (e.g., even numbered columns voltage binned and odd-numbered columns voltage binned), the sense amplifier and ADC within one column in each binned column pair may be disabled to save power, with the transmitted data stream decimated according to the binning mode.

Split-Gate Architecture

Figure 6:
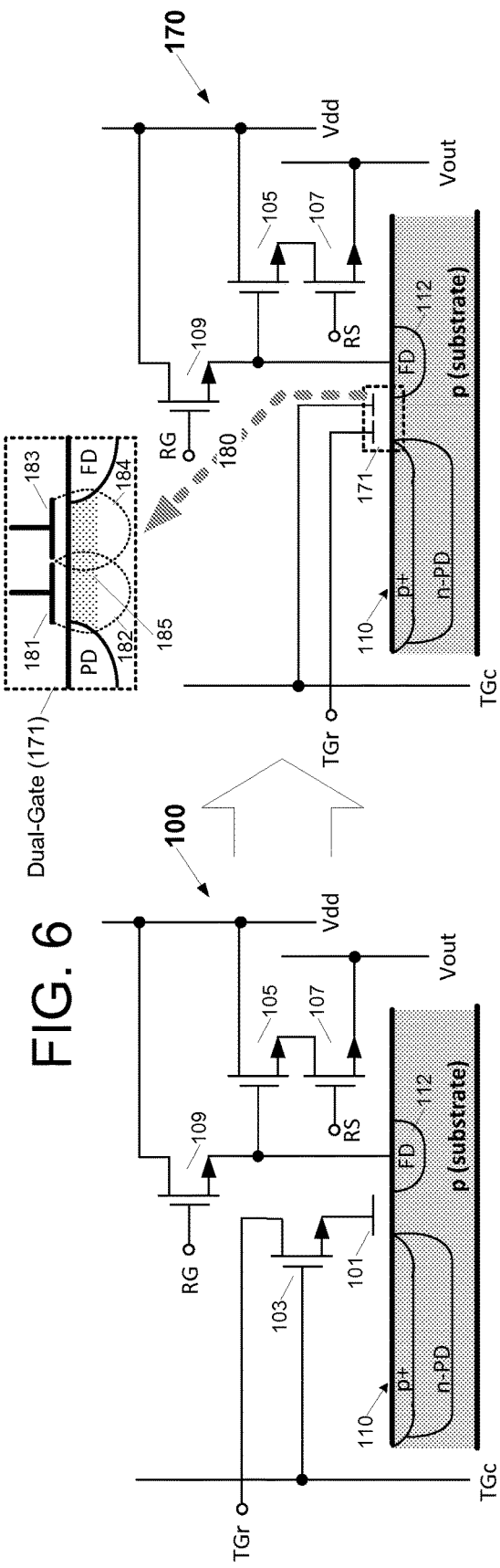
FIG. 6 contrasts embodiments of the conditional-read pixel of FIG. 1 and a "split-gate" conditional-read pixel.

FIG. 6 contrasts embodiments of the conditional-reset pixel 100 of FIG. 1 and a modified pixel architecture 170, referred to herein as "split-gate" conditional-reset pixel or split-gate pixel. In the embodiment shown, split-gate pixel 170 includes a photodiode 110 together with the same floating diffusion 112, reset transistor 109, source-follower 105, and row-select transistor 107 as pixel 100, but omits transfer-enable transistor 103 and single-control transfer-gate 101 in favor of a split, dual-control transfer-gate 171. Referring to detail view 180, dual-control transfer gate (or "dual-gate") includes distinct (separate) row and column transfer gate elements 181 and 183 disposed adjacent one another between photodetector 110 (PD) and floating diffusion 112 (FD). The row and column transfer gate elements (181 and 183) are coupled to row and column control lines, respectively, to receive row and column control signals, TGr and TGc and thus are independently (separately) controlled.

In one split-gate pixel embodiment, the source/drain implant ordinarily required between series-coupled transistors (and thus between adjacent gate terminals) is omitted, thereby enabling the row and column transfer gate elements to be disposed closely enough to form a continuous enhancement channel 185 when both TGr and TGc are asserted, (at a signal level to provide charge transfer), while maintaining an ability to interrupt the channel when either of TGr and TGc is deasserted, (at a signal level to prevent charge transfer). In other embodiments, discussed in greater detail below, one or both of the row and column transfer gates may be entrenched within the substrate between the photodiode and floating diffusion, thereby enabling split-gate implementation with limited or no process variation. In all of these split-gate pixel embodiments, the logic-AND function effected by the combined operation of transfer-gate 101 and transfer-enable transistor 103 in pixel 100 may be achieved within the substantially more compact dual-control gate 171, reducing the pixel footprint (i.e., die area consumption) by a transistor or a significant portion of a transistor relative to pixel 100. In the case of a quad pixel layout, for example, the dual-gate arrangement lowers the per-pixel transistor count from 2.75T (i.e., when pixel 100 is employed) to approximately 1.75T to 2T, depending on the dual-gate implementation. In addition to the reduced pixel footprint, the dual-gate design permits a negative potential, $V_{TG\text{-}Neg}$, to be applied to the transfer gate or transfer gates during the charge-integration (light accumulation) interval to reduce PD to FD leakage current and transfer gate dark current, a function not readily available in embodiment 100 as a negative TGr voltage may disruptively forward-bias the source/drain to substrate diodes in transfer-enable transistor 103. Further, in contrast to the floating potential that results at transfer gate 101 of pixel 100 whenever TGc is lowered, row and column transfer gate elements 181 and 183 are continuously coupled to signal driving sources and thus may be continuously driven to the driver output voltage (i.e., not floating), potentially reducing noise in the pixel read-out operation.

Figure 7:
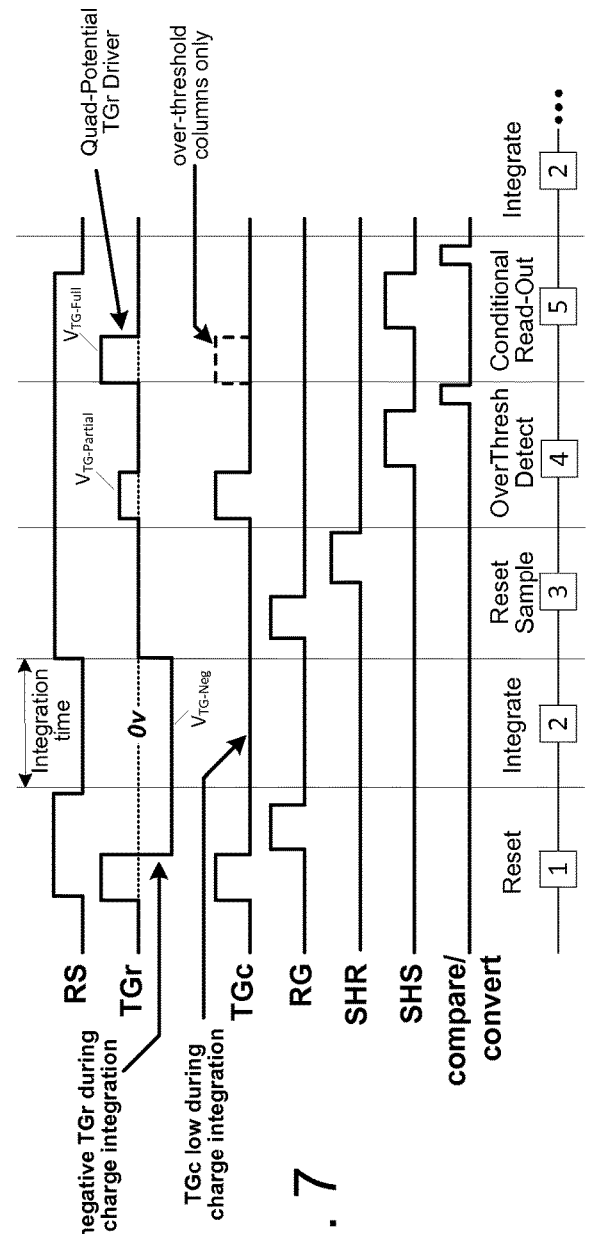
FIG. 7 is a timing diagram illustrating an exemplary pixel cycle (reset/charge integration/read-out) within the split-gate pixel of FIG. 6.

FIG. 7 illustrates an exemplary pixel cycle (reset/charge integration/read-out) within the split-gate conditional-read pixel embodiment of FIG. 6. As with the conditional-read pixel discussed in reference to FIGS. 1-4, the operational cycle of split-gate pixel 170 is split into five intervals or phases corresponding to distinct operations carried out to yield an eventual conditional readout (also, as with the conditional-read pixel of FIG. 1, split-gate pixel 170 can be read out unconditionally by skipping phase 4 or disregarding an underthreshold condition detected in that phase). Referring to both FIG. 7 and split-gate pixel 170 in FIG. 6, a reset operation is executed within the photodiode and floating diffusion in phase one by concurrently raising the TGr and TGc signals to establish a sufficiently deep channel potential between photodiode 110 and floating diffusion 112 (i.e., as shown at 185 in FIG. 6), and thereby reset the photodiode by enabling all of the residual or accumulated charge within the photodiode to be transferred to the floating diffusion. After (or concurrently with) the charge transfer operation, the reset-gate signal (RG) is pulsed to switch on reset transistor 109 and thus evacuate/empty charge from the floating diffusion by switchably coupling the floating diffusion to $V_{dd}$ or other supply voltage rail. In the embodiment shown, TGr is driven to a negative potential, $V_{TG-Neg}$, following the photodetector reset operation (e.g., immediately after concurrent assertion with TGc or at the conclusion of the reset phase), thereby establishing a low-leakage isolation between the photodetector and floating diffusion, and reducing dark current from the region below TGr. Also, because the row and column control signals are jointly applied to adjacent transfer gate elements, TGc may be raised and lowered as necessary following the photodetector reset operation and during the ensuing integration phase (phase 2) without undesirably floating the transfer gate. Thus, TGc is lowered following pixel reset and, while shown as remaining low throughout the ensuing integration and noise sampling phases (phases 2 and 3), will toggle between high and low states during those phases to support reset and read-out operations in other pixel rows.

Figure 14:
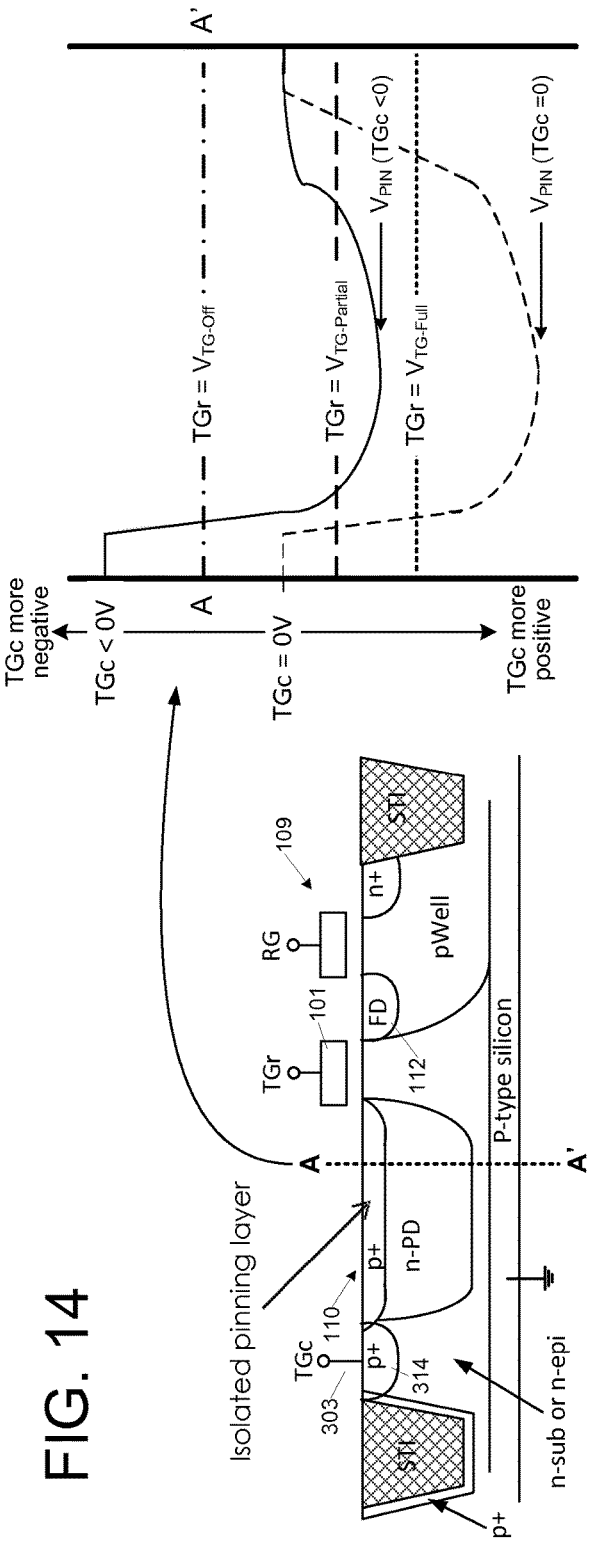
FIG. 14 is an exemplary diagram of the electrostatic potential across device section A-A' of the conditional-read pixel embodiment of FIG. 13.

The noise or reset sampling operation within phase 3, overthreshold detection within phase 4 and conditional read-out (or conditional transfer) within phase 5 are carried out generally as discussed in reference to FIG. 2, except that TGc need only be raised in conjunction with the TGr pulses (i.e., to $V_{TG-Partial}$ and $V_{TG-Full}$) during the partial-transfer and conditional-transfer operations. In the embodiment shown, a quad-potential TGr driver is provided within the row decoder/driver (e.g., within element 305 of FIG. 14) to maintain TGr at the negative potential throughout the integration phase, and then step TGr up to a pre-read potential (zero volts in the example shown) at the start of the noise sampling phase before raising TGr further to $V_{TG-Partial}$ and finally to $V_{TG-Full}$ in the overthreshold detection and conditional read-out operations, respectively. In alternative embodiments, a three-potential driver may be used to maintain TGr at the negative potential except when pulsed to $V_{TG-Partial}$ or $V_{TG-Full}$ (i.e., no pre-read potential).

Figure 8:
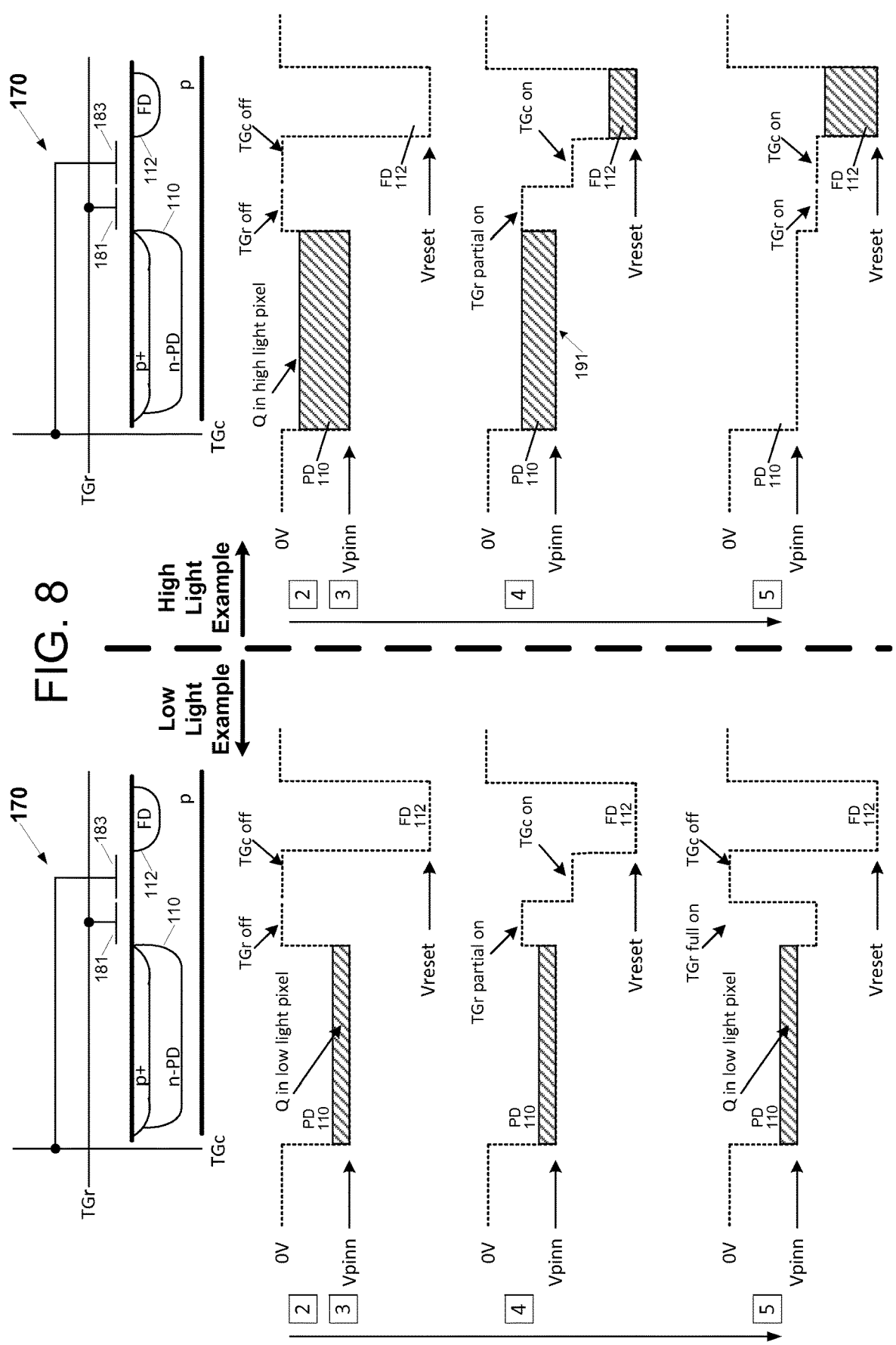
FIG. 8 illustrates exemplary low-light and high-light operation of the split-gate pixel of FIG. 6, showing electrostatic potential diagrams in each case beneath schematic cross-section diagrams of the photodetector, dual-control transfer gate and floating diffusion.

FIG. 8 illustrates exemplary low-light and high-light operation of the split-gate pixel of FIG. 6, showing electrostatic potential diagrams in each case beneath schematic cross-section diagrams of the photodetector (photodiode 110 in this example), row and column transfer gate elements 181 and 183 (i.e., forming a dual-control transfer gate) and floating diffusion 112. As in preceding examples, the depicted levels of electrostatic potential are not intended to be an accurate representation of the levels produced in an actual or simulated device, but rather a general (or conceptual) representation to illustrate the operation of the pixel read-out phases. Starting with the low-light example, a relatively low level of charge is accumulated within the photodiode during the integration phase (phase 2) so that, when TGc is asserted and TGr is raised to the partial-on potential ($V_{TG-Partial}$) during overthreshold detection phase 4 (i.e., after noise sample acquisition in phase 3), the charge level is insufficient to be transferred via the relatively shallow channel formed between photodiode 110 and floating diffusion 112. Because the accumulated charge level does not exceed the transfer threshold established by application of $V_{TG-Partial}$ to the gate element couple to the TGr line, there is no (or negligible) charge transfer from the photodiode to the floating diffusion with the accumulated charge instead remaining undisturbed within the photodiode. Because no charge transfer is detected during the overthreshold-detection phase, TGc is deasserted during conditional read-out phase 5. Although some charge will migrate to the well under the row gate during TGr assertion, that charge will move back to the photodiode well when TGr is deasserted, thus maintaining the charge level within the photodiode as a starting point for further charge accumulation in a subsequent integration interval. By contrast, in the high-light example, the higher level of accumulated charge does exceed the transfer threshold during overthreshold detection phase 4 so that a portion of the accumulated charge (i.e., that subset of charge carriers that are above the transfer gate partially-on electrostatic potential) spills over into floating diffusion node 112, with the residual accumulated charge remaining within the photodiode as shown at 191. Accordingly, during overthreshold phase 5, TGr is raised to the $V_{TG-Full}$ potential concurrently with assertion of TGc, thus establishing a full conduction path through the channel formed by the dual-gate structure to transfer the entirety of the accumulated charge from photodiode 110 to floating diffusion 112.

Figure 9:
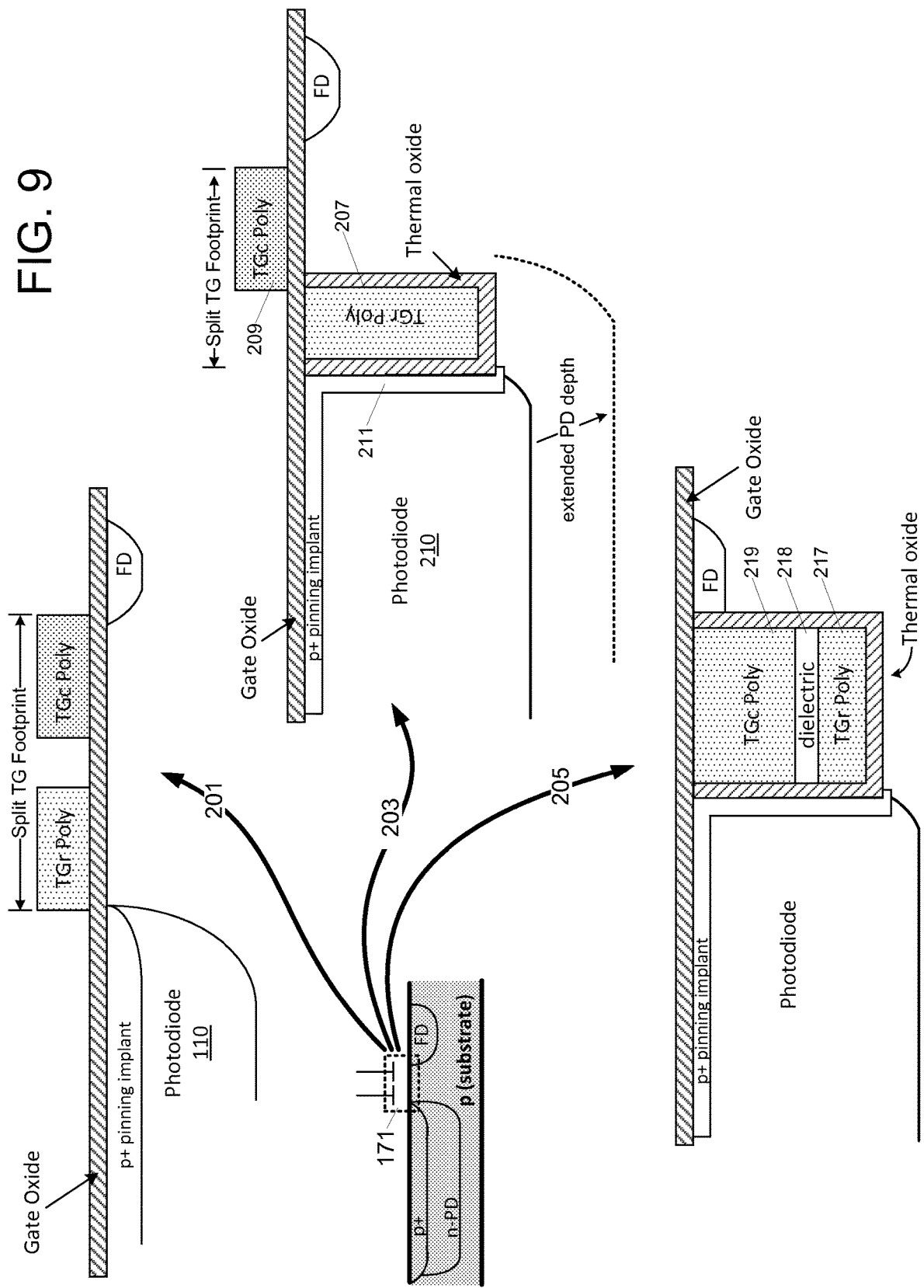
FIG. 9 illustrates additional embodiments of dual-control transfer gates that may be used to implement split-gate conditional-read pixels.

FIG. 9 illustrates additional embodiments of dual-control transfer gates that may be used to implement split-gate conditional-read pixels. In one embodiment, shown at 203, the dual-control transfer gate 171 of a split-gate pixel is implemented by a combination of entrenched and surface-layer polysilicon features 207 and 209. In the example shown, for instance, the row-gate poly feature 207 ("TGr poly") is formed in a trench that has been lined with a thermal oxide which serves as a gate oxide with respect to the silicon substrate. The p+ pinning layer 211 of the pinned photodiode 210 extends adjacent one wall of the trench containing the TGr poly and the column-gate poly feature 209 is disposed over a gate oxide that covers the photodiode and trench. Though not specifically shown, circuit contact to the TGr poly is established by a contact etch or other conductive through-passage in the gate oxide layer.

In contrast to the additional, possibly non-standard process steps employed to implement side-by-side dual-control gate embodiments (shown, for contrast, at 201), the entrenched poly embodiment 203 may be fabricated using standard CMOS manufacturing processes where trench gates are used. Also, as can be seen by comparing the entrenched poly embodiment 203 with the side-by-side poly embodiment 201, submerging one of the two poly features below the gate oxide layer enables the two poly features 207, 209 to be disposed more closely together (even to the point of overlapping along an axis parallel to the gate oxide layer), substantially reducing the transfer gate footprint (die area). Further, subthreshold leakage is generally reduced by the increased charge-transfer channel length as the channel follows the outer perimeter of the thermal oxide through the device substrate from the photodiode to the floating diffusion. Also, it may be possible to extend the depth of the n-photodiode region due to the deeper disposition of the charge-transfer channel resulting from the entrenched TGr poly feature. Although not specifically shown, the positions of the TGr and TGc poly features (207 and 209) may be reversed in alternative embodiments, with the TGc poly being disposed in the thermal-oxide-lined trench and the TGr poly riding above the gate oxide.

Still referring to FIG. 9, an even more compact transfer gate may be implemented by stacking the row and column poly features within the same trench as shown, for example, in embodiment 205. As shown, the trench is lined with a thermal oxide as in embodiment 203, with TGr poly feature 217 deposited (or otherwise formed) at the bottom of the trench, followed by a dielectric layer 218 (e.g., $SiO_2$) and then a TGc poly feature 219. Because no space need be reserved for the surface poly feature, the floating diffusion (FD) may be moved to a position adjacent the thermal oxide of the trench, thus effecting an extremely compact dual-gate arrangement. The TGr and TGc poly dispositions may be reversed in alternative embodiments, with the TGc poly being formed in the deeper region of the trench and the TGr poly in the shallower region. Also, to enable sufficient separation between the TGr and TGc contacts, the lower-layer poly feature (i.e., TGr in this example) may extend to a point not covered by the TGc poly so that a conductive contact may extend downward to the lower-layer poly feature without contacting the upper layer poly feature.

FIGS. 10A and 10B illustrate embodiments of pixel architectures in which the entrenched poly-gate arrangements shown in embodiments 203 and 205, respectively, of FIG. 9 are formed above instead of beside photodiode layers, yielding an extremely compact pixel footprint. In the embodiments shown, the substrate ("p-epi") may be thinned or otherwise processed to expose the photodiode at the underside of the substrate and thus permit backside illumination.

PMOS Transfer-Enable Pixel

Figure 11:
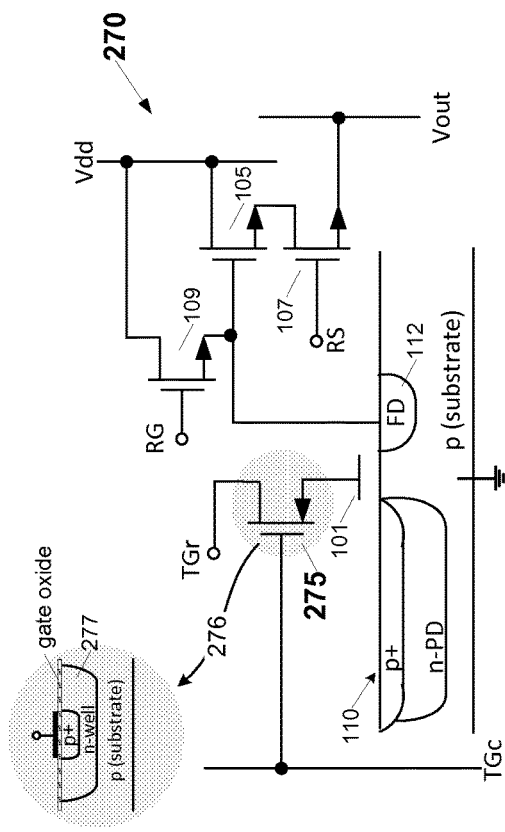
FIG. 11 illustrates an alternative embodiment of a conditional-read pixel in which the transfer-enable transistor is implemented by a PMOS transistor instead of the NMOS transistor used in conditional-read pixel 100.

FIG. 11 illustrates an alternative embodiment of a conditional-read pixel 270 in which the transfer-enable transistor (i.e., transistor switched between conducting and non-conducting states by the TGc signal) is implemented by a P-type transistor 275 (P-type MOSFET or PMOS transistor) instead of the N-type transistor 103 (NMOS) used in conditional-read pixel 100 of FIG. 1 (transfer gate 101, photodiode 110, floating diffusion112, and transistors 105, 107 and 109 may be implemented and interconnected generally as described in reference to FIG. 1).

Figure 12:
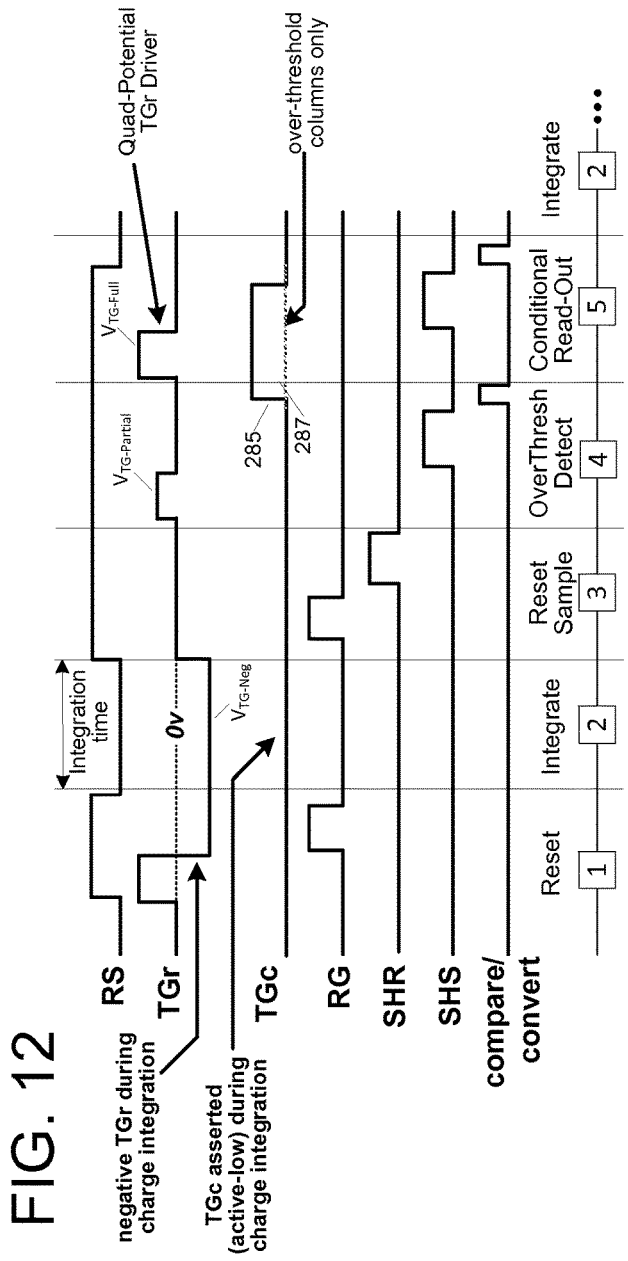
FIG. 12 is a timing diagram illustrating an exemplary pixel cycle (reset/charge integration/read-out) within the pixel embodiment of FIG. 11.

Referring to the exemplary pixel cycle diagram in FIG. 12, the PMOS transfer-enable transistor 275 enables a negative TGr signal ($V_{TG-Neg}$) to be applied to transfer gate 101 during charge integration intervals (in contrast to the NMOS transfer-enable transistor shown in FIG. 1 in which such negative TGr potential would undesirably forward-bias the P-N junction between the substrate and the source/drain regions of the transistor), thereby improving sensor SNR by reducing subthreshold leakage from photodiode 110, and reducing dark current from transfer gate 101. As shown, the column transfer-gate control signal TGc becomes active-low instead of active-high and may be held active (i.e., driven low) at all times except during the conditional read/reset operation in the final phases of the pixel cycle. In the embodiment shown, for example, just prior to assertion of $V_{TG-Full}$ on the TGr line (i.e., at 285), the TGc line is deasserted (raised) for columns where the pixel is below threshold, and remains asserted (lowered) at 287, for over-threshold columns only. That is, TGc is asserted (driven low) if an overthreshold condition was detected in the previous phase, and deasserted (maintained in the high state) for the duration of the $V_{TG-Full}$ pulse if no overthreshold condition was detected. Note that, while shown as being held active throughout the charge integration interval, the TGc signal will in actuality be conditionally pulsed during that interval (and possibly others) to complete conditional readout operations for other rows of pixels.

Referring again to FIG. 11, although PMOS transistor 275 consumes a larger die area than an NMOS counterpart (i.e., by virtue of the n-well 277 formed within the substrate to implement PMOS transistor 275 as shown in detail view 276), this additional die area may be available in image sensor having larger pixels (e.g., an image sensor of a digital single-lens reflex (DSLR) camera). Also, in a number of embodiments, PMOS transistor 275 is implemented in a separate die from the die containing photodiode 110 and other pixel structures. In one such embodiment, the two dies (or more) may be stacked with back-to-back contact surfaces in a three-dimensional (3D) integrated-circuit configuration, thus enabling direct contact between an array of PMOS transistors 275 formed in one die and an array of remaining pixel elements (i.e., specifically, coupling drain terminals of the PMOS transistors to gate terminals of transfer gates 101) formed in the other die. In that case, the pixel die may be fabricated to enable backside illumination, with front-side contact to the die containing the array of PMOS transfer-enable transistors 275.

Read-Out Masking Pixel

In conditional-read pixel embodiments described thus far row and column control signals are, in effect, logically ANDed to activate a transfer gate (i.e., establish a conduction channel) between the photodiode and floating diffusion of a pixel—the logical AND being effected, for example, through a transfer-enable transistor that applies a TGr potential to the transfer gate only if TGc is asserted, or a dual-control (split) transfer gate in which the conduction channel is formed only if both TGc and TGr are asserted.

Figure 13:
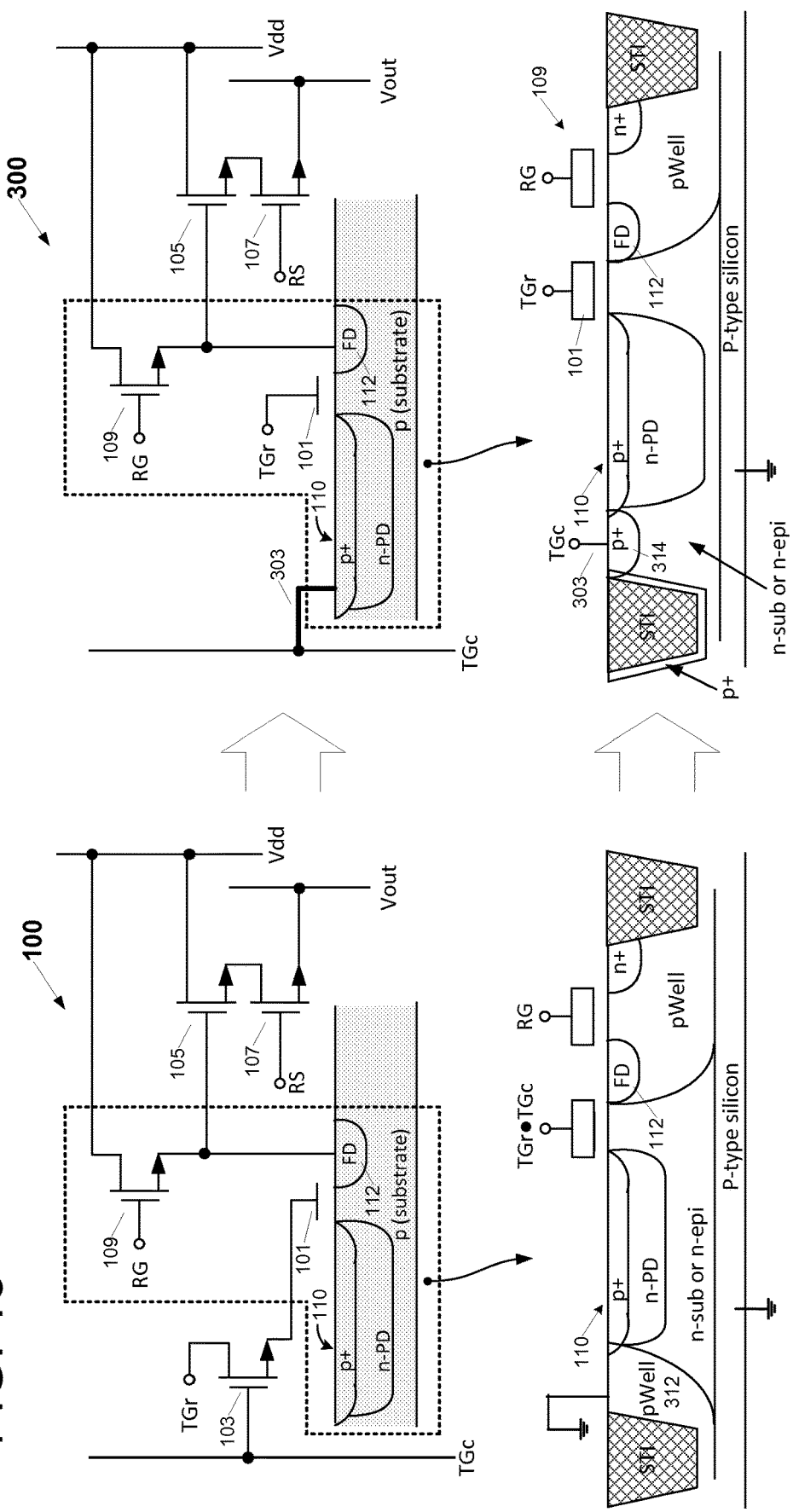
FIG. 13 illustrates an alternative embodiment of a conditional-read pixel in which the transfer gate is controlled directly by the row control signal, TGr, with the column control signal, TGc, being applied to dynamically adjust the fully depleted photodiode potential.

FIG. 13 illustrates an alternative embodiment of a conditional-read pixel 300 in which transfer gate 101 is controlled directly by row control signal TGr, and in which column control signal TGc is applied to the pinning layer of photodiode 110 to dynamically adjust the photodiode depletion potential. By this arrangement, instead of controlling the state of the transfer gate based on a logical AND of the row and column control signals, during read operations the transfer gate is driven to the same partial or full transfer potential for each pixel on a current row and thus not used to control selective readout, and, instead, the photodiode depletion voltages for each of the pixels along the row are manipulated according to the state of the column control signal to enable or mask (suppress) charge transfer from photodiode 110 to floating diffusion 112.

As can be seen by comparing the exemplary architecture and layout diagrams for conditional-read pixel 300, referred to herein as a "read-out masking pixel," with conditional-read pixel 100 (copied from FIG. 1), transfer-enable transistor 103 is omitted altogether from read-out masking pixel 300, with the TGr line coupled directly to transfer gate 101 and TGc coupled to the p+ pinning implant as shown at 303. This arrangement enables the depletion potential of the photodiode to be dynamically raised and lowered under control of the TGc signal. More specifically, when read-out masking is desired, TGc may be raised to drive the photodiode depletion potential to a level that prevents full charge transfer despite formation of a normal transfer channel potential between the photodiode and floating diffusion (i.e., despite applying $V_{TG\text{-}Full}$ at transfer gate 101). More specifically, as illustrated in the electrostatic-potential diagram of FIG. 14 (showing the potential across device section A-A'), shifting TGc to a more positive voltage (positive being in the downward direction), correspondingly increases the depletion potential, $V_{PIN}$, of the pinned photodiode, thereby preventing charge transfer by moving the depletion potential below the channel potential that results when TGr is raised to $V_{TG\text{-}Full}$ (exemplary TGr levels corresponding to the $V_{TG\text{-}off}$ and $V_{TG\text{-}Partial}$ potentials are also shown). Alternately stated, the fully depleted potential or pinned diode potential is designed to be large or deep when 0V is applied to the pinning layer. As a result, the application of $V_{TG\text{-}FULL}$ to the TG does not provide full charge transfer from the PD. By applying a negative voltage to the pinning layer, $V_{PIN}$ is reduced to a point where the application of $V_{TG\text{-}FULL}$ to the TG does provide full charge transfer from the PD.

Returning to FIG. 13 and comparing the exemplary layout cross-sections for conditional-read pixels 100 and 300, it can be seen that the p-well 312 within pixel 100 that interconnects the pinning implant (p+ layer of photodiode 110) to the grounded substrate region (thereby grounding the pinning implant and establishing a depletion voltage at some positive potential according to the n-dopant concentration of the photodiode, n-type substrate region, and surrounding p-type regions) is omitted in pixel 300 in favor of a P+ diffusion region 314 coupled to column control line, TGc (i.e., by interconnect 303). By this arrangement, the potential of the TGc line controls the potential of the pinning implant and thus the depletion voltage of photodiode 110 (which is offset from the pinning implant potential in accordance with the dopant concentrations of the photodiode diode and surrounding regions). Except for a possible change in photodiode dopant concentration (as discussed below), no other significant changes in the pixel implementation are required, as the shallow-trench isolation structures (STI), transfer gate 101, floating diffusion 112 and reset transistor 109 (as well as transistors 107 and 105, not shown) may be implemented in the same way in each of the two pixel embodiments.

Figure 15:
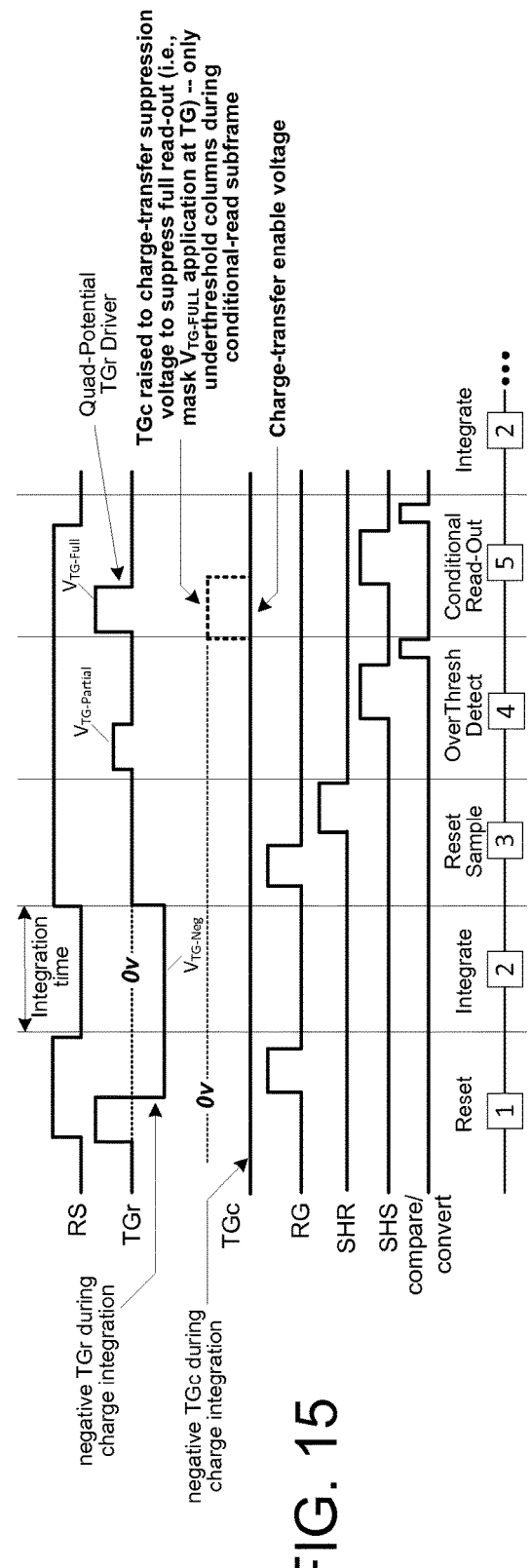
FIG. 15 is a timing diagram illustrating an exemplary pixel cycle diagram corresponding to the read-out masking pixel of FIG. 11, showing the five-phase operation discussed above.

FIG. 15 presents an exemplary pixel cycle diagram corresponding to the read-out masking pixel of FIG. 11, showing a corresponding version of the five-phase operation discussed above with respect to other pixel embodiments. Except for the column control signal, TGc, the signal waveforms generally correspond to those shown in FIG. 7 for the split-gate pixel embodiment (including the ability to hold TGr negative during integration). More specifically, because the TGc signal is now used to control the photodiode depletion potential, TGc is generally held at a negative potential during charge integration and then selectively raised to a readout-masking potential (0 v in this example) only during the full read-out phase of the pixel cycle. More specifically, if the partial-read result indicates an overthreshold condition, or if an unconditional read is to be executed, TGc is maintained at the negative potential through the conditional read-out phase (phase 5) or at least until the full-read sample is captured (sometime after the second rising edge of SHS). By contrast, if the partial-read result indicates an underthreshold result, the TGc signal is raised to the masking potential for an interval that spans the $V_{TG\text{-}Full}$ pulse duration, thereby shifting the photodiode depletion potential to a sufficiently positive voltage to suppress full charge transfer from the photodiode to the floating diffusion despite application of the $V_{TG\text{-}Full}$ potential on the TGr line—in effect, masking the photodiode readout that would occur if TGc remained at the negative potential.

Figure 16:
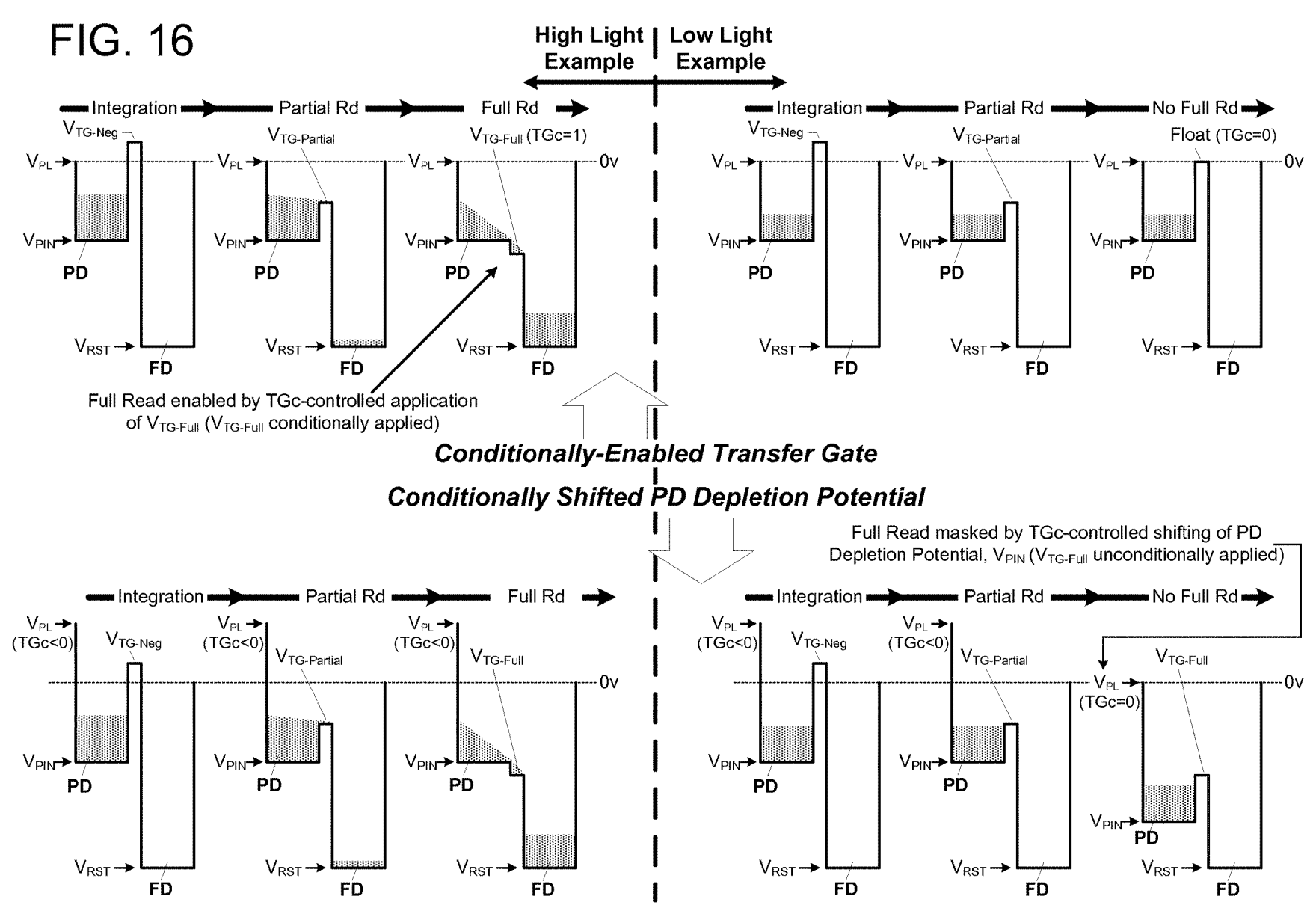

FIG. 16 illustrates relative electrostatic states of the photodiode 110, transfer gate 101 and floating diffusion 112 during the charge-integration and read-out phases of the pixel operation, contrasting pixels having conditionally-enabled transfer gates (e.g., as in pixel 170 of FIG. 6) in the upper half of FIG. 16, with read-out masking pixels having conditionally-shifted photodiode depletion potentials in the lower half of FIG. 16. Referring first to the bright-light (high light) example shown in the left side of FIG. 16, similar pixel cycle operations are carried in the conditionally-enabled transfer gate pixel (upper left quadrant of FIG. 16) and read-out masking pixel (lower left quadrant) as, in each case, the overthreshold condition detected during the partial-read phase (i.e., when $V_{TG\text{-}Partial}$ is applied on the TGr line to partially lower the electrostatic barrier between the photodiode and floating diffusion) is followed by applying $V_{TG\text{-}Full}$ to the transfer gate to fully lower the electrostatic barrier between the photodiode and floating diffusion and thus permit full transfer of charge integrated within the photodiode to the floating diffusion. One operational difference to be appreciated in this regard is that the application of $V_{TG\text{-}Full}$ on the TGr line is conditioned on assertion of TGc in the conditionally-enabled transfer gate pixel, but carried out unconditionally in the read-out masking pixel. Another notable difference is the pinning layer potential, $V_{PL}$, employed in the two pixel architectures. That is, in the conditionally-enabled transfer gate pixel, the pinning layer is fixed at zero volts, with the photodiode dopant concentration being sufficient to establish a depletion voltage, $V_{PIN}$ at a desired potential more positive than $V_{TG\text{-}Partial}$ and more negative than $V_{TG\text{-}Full}$. By contrast, in the read-out masking pixel, a negative TGc signal is applied to drive the pinning layer negative while an increased dopant concentration within the photodiode maintains the photodiode depletion voltage at the desired potential between the $V_{TG\text{-}Partial}$ and $V_{TG\text{-}Full}$ voltage levels. That is the photodiode is fabricated with a raised dopant concentration to increase the pinned diode potential $V_{PIN}$, thereby counteracting the more negative pinning layer potential (i.e., when TGc is at the lower, non-masking signal state) to maintain approximately the same photodiode depletion voltage as in the conditionally-enabled transfer gate pixel.

Referring now to the exemplary low-light operations shown in the rightmost half of FIG. 16, the underthreshold detection during the partial-read phase of the conditionally-enabled transfer gate pixel results in deassertion of the TGc signal during the full-read phase, thus blocking application of $V_{TG\text{-}Full}$ to prevent charge transfer between the photodiode and floating diffusion. By contrast, in the read-out masking pixel, $V_{TG\text{-}Full}$ is applied to TGr despite the underthreshold detection (i.e., $V_{TG\text{-}Full}$ is applied unconditionally to all pixels on the current row), with charge-transfer instead being blocked on selected pixels by raising the TGc signal level (and thus the pinning layer potential) so as to correspondingly raise the photodiode depletion potential (i.e., moving $V_{PIN}$ downward in the diagram of FIG. 16) to a level that maintains the electrostatic barrier between the photodiode and floating diffusion, and a photodiode potential well that is large enough so the underthreshold charge level does not reach or exceed the TG channel potential. In the example shown, TGc is raised to the masking potential (i.e., zero volts in this example) in response to the underthreshold detection, thus maintaining the electrostatic barrier between the photodiode and floating diffusion at a level at least as high as the electrostatic barrier applied during the partial read phase (i.e. when TGc is negative and $V_{TG\text{-}Partial}$ is applied to the transfer gate). In alternative embodiments, TGc may be raised to a masking potential above zero volts and/or the dopant concentration within the photodiode may be increased so as to enhance the electrostatic barrier between the photodiode and floating diffusion during the read-out masking operation.

Figure 17A:
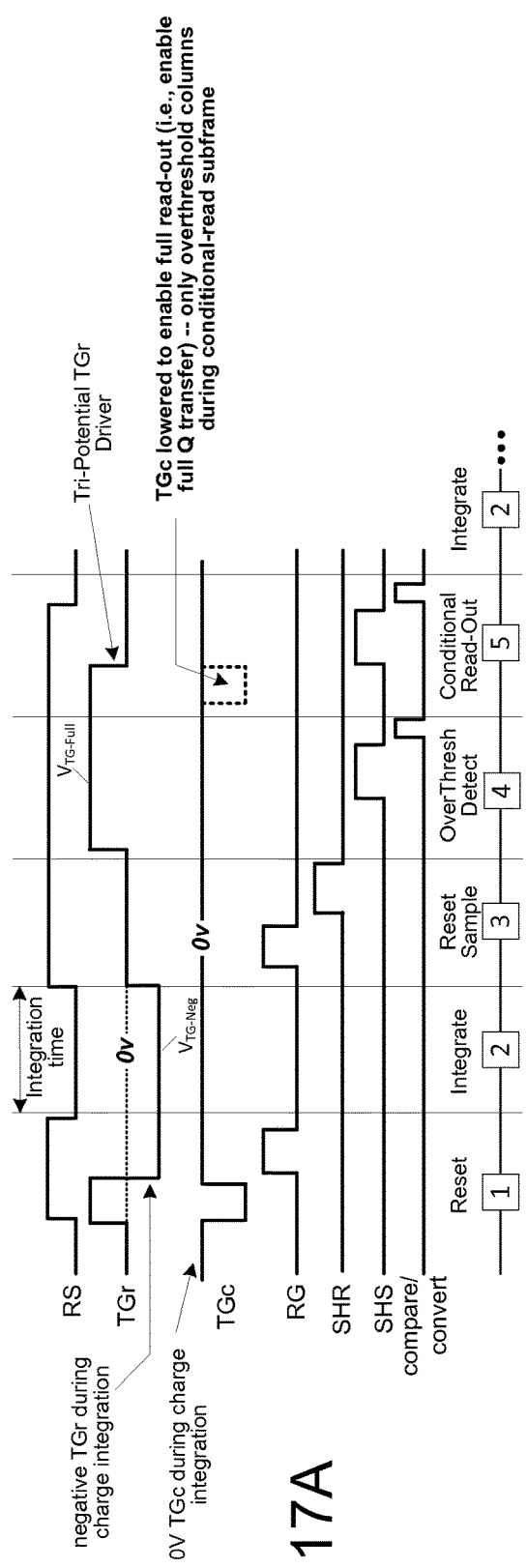
FIGS. 17A and 17B illustrate an alternative read-out sequence in which a column control line TGc is maintained at 0 v during charge integration, raising the photodiode depletion potential relative to the read-out sequence of FIGS. 15 and 16.
Figure 17B:
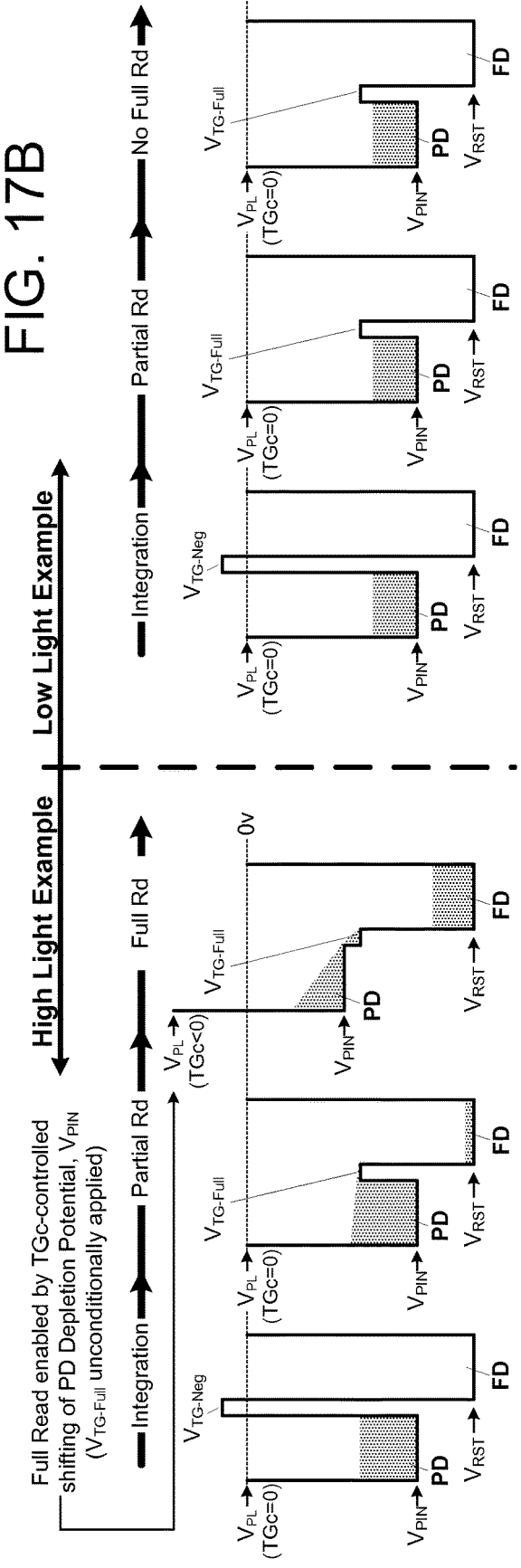

FIGS. 17A and 17B illustrate an alternative read-out sequence in which TGc is maintained at 0 v during charge integration, raising the photodiode depletion potential (and thus effectively increasing the full well capacity) relative to the read-out sequence of FIGS. 15 and 16. As shown in the exemplary low-light and high-light electrostatic diagrams of FIG. 17B, threshold assessment may be carried out by applying $V_{TG\text{-}Full}$ (instead of $V_{TG\text{-}Partial}$) to the transfer gate, as this voltage will not fully empty the diode. Also, instead of separate TGr pulses, a single $V_{TG\text{-}Full}$ pulse may be applied on the TGr line during an extended interval that spans both the overthreshold detection and conditional read-out phases of the pixel cycle. In alternative embodiments, respective (separate) $V_{TG\text{-}Full}$ pulses may be generated during the overthreshold conditional read-out phases of the pixel cycle. Also, a $V_{TG\text{-}Partial}$ voltage somewhat lower than $V_{TG\text{-}Full}$ may be applied during the overthreshold phase. In any case, if charge is detected for a pixel within a given column during the threshold assessment (i.e., overthreshold condition detected), then the TGc line for that column is lowered (i.e., to a negative voltage) to effect a full transfer of the remaining charge from the photodiode to the floating diffusion as shown in the high light example of FIG. 17B. In the case of underthreshold determination for the pixel within a given column, the TGc line for that column is maintained at 0 v to permit continued integration. This operation is shown in the low light example (right-hand side) of FIG. 17B.

Figure 18:
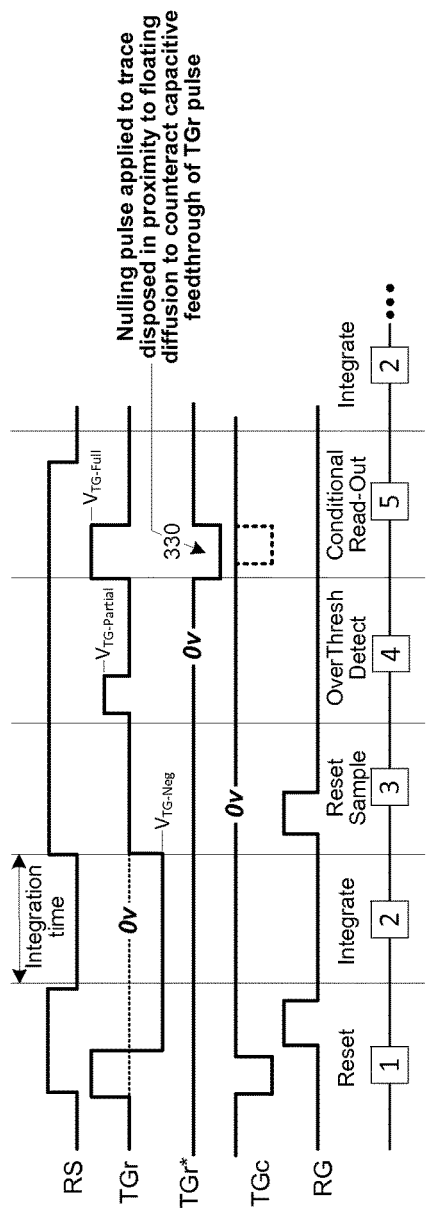
FIG. 18 illustrates an exemplary pixel read-out timing diagram in which separate transfer-gate enable pulses are applied during the overthreshold detection phase and read-out detection phases of the pixel cycle, and in which a low-going nulling pulse is asserted on a row signal line that extends in proximity to the floating diffusions within the selected row of pixels.

FIG. 18 illustrates a subset of the read-out control signals shown in FIG. 17A, but in this example splitting the single TGr pulse into two separate pulses applied during the overthreshold detection phase (TGr=$V_{TG\text{-}Partial}$) and read-out phase (TGr=$V_{TG\text{-}Full}$), respectively. Additionally, a low-going TGr nulling pulse is asserted on a row signal line "TGr*" that extends in proximity to the floating diffusions within the selected row of pixels (there being one such "nulling" line for each pixel row in at least one embodiment). The nulling pulse counteracts capacitive feed-through resulting from application of the TGr pulse during the read-out phase, thus reducing noise during the read-out operation. In alternative embodiments, a nulling pulse may additionally be generated concurrently with the TGr pulse during the overthreshold detection phase. Also, the nulling operation may be performed irrespective of whether the same or different TGr pulse potentials are applied during the overthreshold detection and read-out phases. Also, in the case of a single TGr pulse that extends from the overthreshold detection phase to the read-out phase of the pixel cycle (i.e., as shown in FIG. 17A), a single corresponding nulling pulse may be generated at an appropriate time with respect to the TGr pulse. Further, while the nulling pulse is shown as transitioning from 0 v to a negative voltage, a low-going pulse that transitions from a positive to a negative voltage, or even from a positive voltage to a less positive voltage may alternatively be applied. More generally, nulling pulses may be generated at appropriate times to counteract any control signal feed-through including, for example and without limitation, feed-through from the read-select signal assertion (RS), reset-gate signal assertion (RG), column-control signal (TGc) or other pinning-layer control signal, etc.

Figure 19:
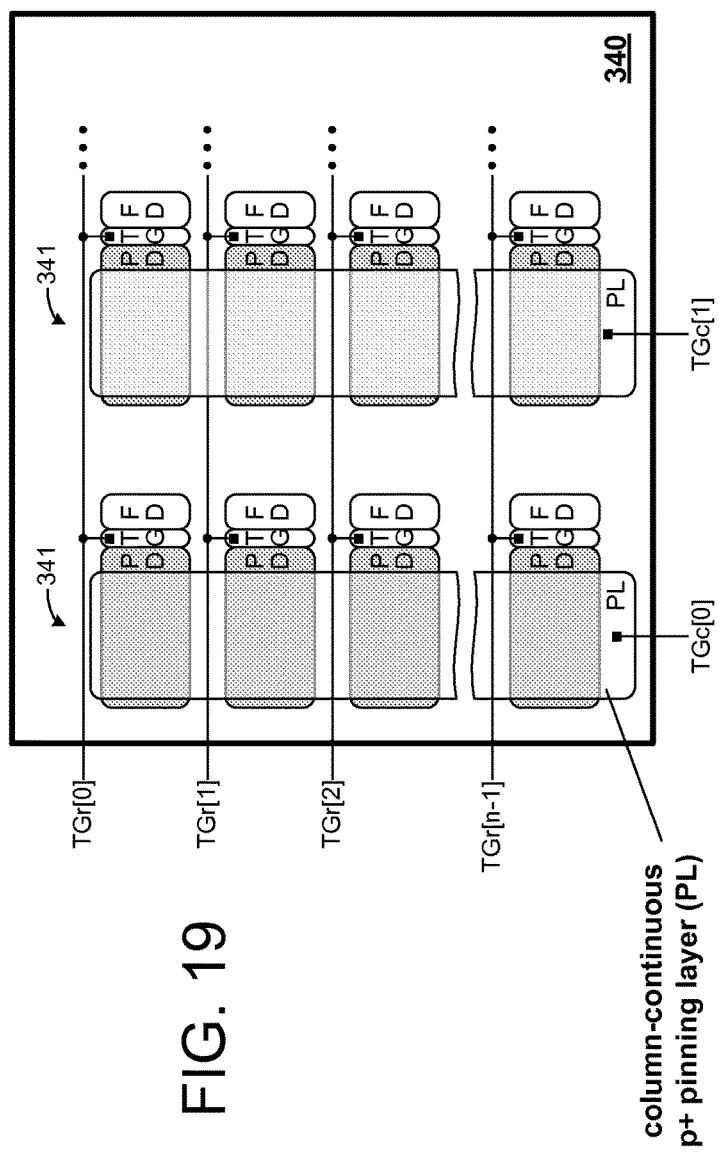
FIG. 19 illustrates an exemplary pixel array showing two columns of read-out masking pixels and a column-spanning photodiode pinning layer.

FIG. 19 illustrates an exemplary pixel array 340 showing two columns (341) of read-out masking pixels. For simplicity, only the photodiode (PD), transfer gate (TG) and floating diffusion elements of each pixel are shown, with the transfer gate for each row of pixels 'i' coupled to a respective row control line (TGr[i], where 'i' ranges from 0 to n−1). In the embodiment shown, a shared photodiode pinning layer (PL) extends across each pixel column 341 and is coupled to a respective column control line (TGc[j], where T ranges from 0 to m−1). Alternately stated the pinning layer for the pixels in a single column are electrically connected, while being isolated from the pinning layer of adjacent columns. In alternative embodiments, a separate pinning layer may be provided for each pixel with a given column or for sub-groups of pixels within a column (i.e., each such pinning layer spanning the photodiodes within of a group of more than one but fewer than n pixels), with each such pinning layer being driven by a separate control line or coupled together, for example, via a metal-layer interconnect. In any case, the pinning layer or pinning layers may be considered as forming a component of the spanned or (adjacent) photodiode(s).

Figure 20A:
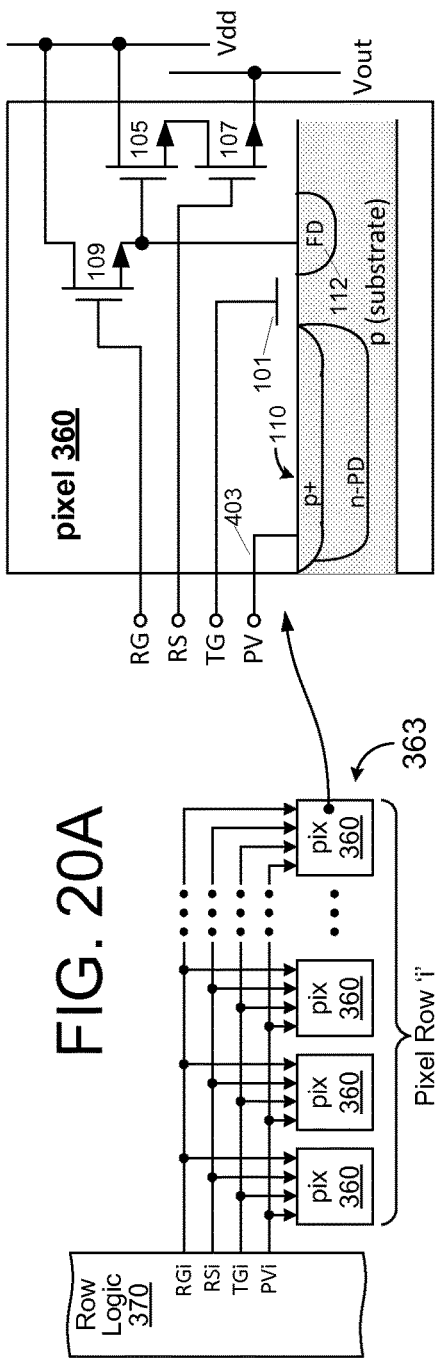
FIGS. 20A-20C illustrate an alternative embodiment of an integrated-circuit imaging device in which all pixel read-out operations are executed unconditionally through concurrent assertion of transfer gate and pinning-voltage control signals.
Figure 20C:
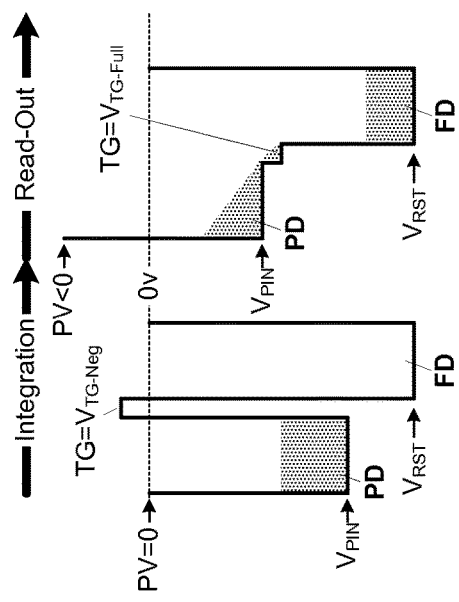
Figure 20B:
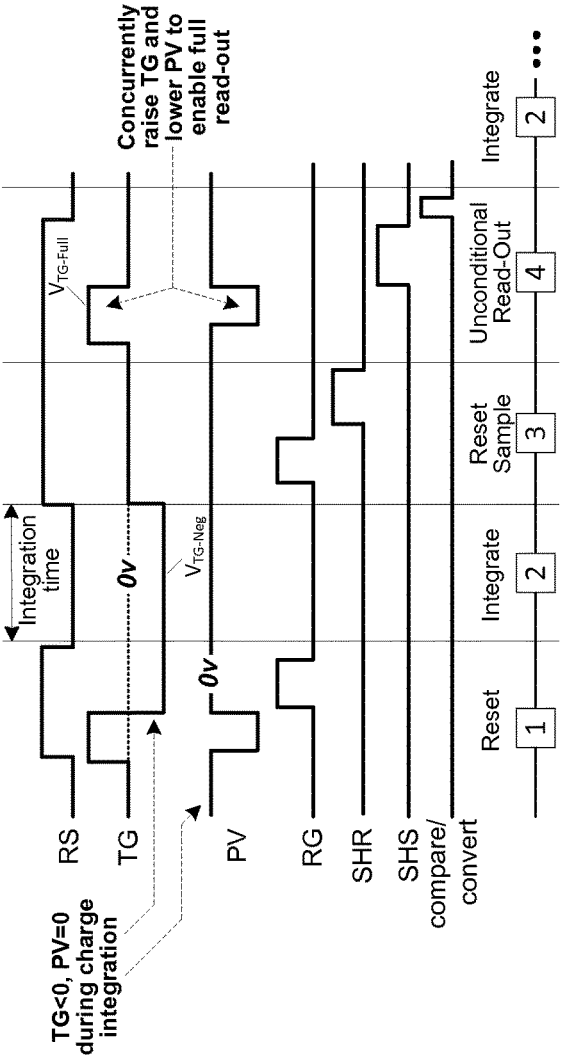

FIGS. 20A-20C are directed to an alternative embodiment of an integrated-circuit imaging device in which all pixel read-out operations are executed unconditionally through concurrent assertion of transfer gate and pinning-voltage control signals, TG and PV. Referring first to the embodiment of FIG. 20A, because all pixels 360 in a selected row 363 (or group of rows in a binned read operation) are read-out unconditionally and concurrently, the TG and PV inputs of each pixel in that pixel row 'i' may be coupled in common to TGi and PVi row control lines. Also in this embodiment, the pinning layers of pixels in a row are electrically connected to each other (or implemented by a continuous pinning layer that spans all pixels in the row in a manner corresponding to the column-spanning pinning layer shown in FIG. 19, or multiple interconnected pinning layers that each span a subset of pixels in the row) while being isolated from other p-type regions in the pixel and isolated from the pinning layer of pixels in adjacent rows. Those lines, in turn, may be driven deterministically by row logic 370 throughout the pixel cycle. This operation is shown in greater detail in the timing diagram of FIG. 20B, which shows the concurrent high-going and low-going pulses TG and PV pulses applied to enable hard reset (phase 1) and unconditional read-out (phase 4 as there is no overthreshold detection phase in this case). The row logic 370 may assert the read-out select signals (RS) and reset-gate control signals (RG) for each pixel row as generally described above (and shown in FIG. 20B).

Figure 21:
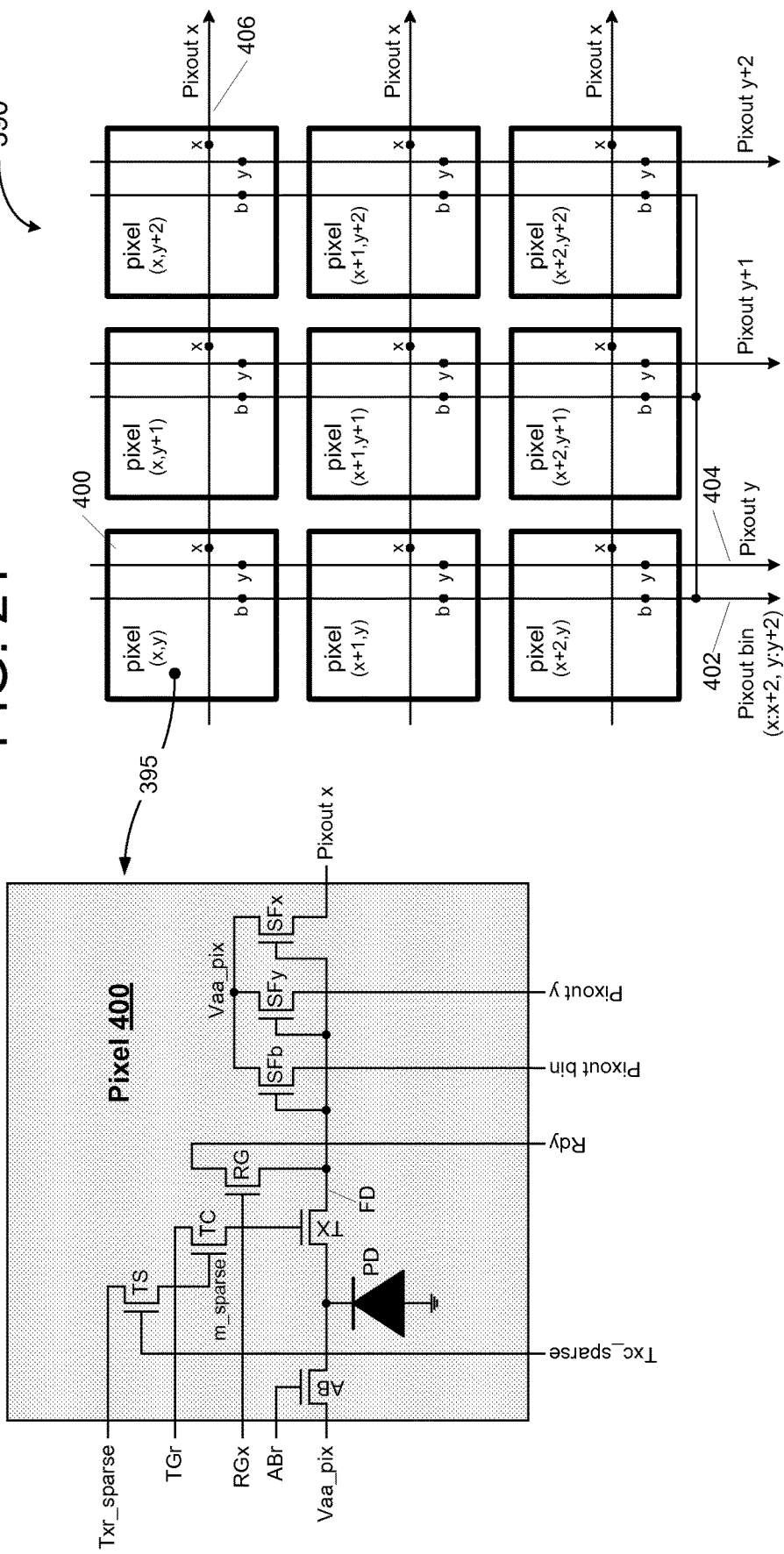
FIG. 21 illustrates an embodiment of a pixel array subsection populated by multi-output pixels.

FIG. 20C illustrates the electrostatic arrangement that results during the integration and read-out phases shown in FIG. 20B. As shown, maintaining the row-based pinning-layer control signal PG at 0 v during charge integration enhances (increases) the full well capacity of the photodiode as generally described in reference to FIGS. 17A-17B. During the read-out phase, the transfer gate signal TG is raised (e.g., to $V_{TG\text{-}Full}$) while PV is driven to a negative potential, thereby enabling full charge transfer from the photodiode to floating diffusion. Through this dual-control approach, the full well capacity of the PD can be increased relative to conventional pixel architectures and the trade-off otherwise required between FD voltage range and $V_{pin}$ can be relaxed. Additionally, a lag-free PD and TG structure may be more easily achieved without the need for a $V_{TG-Full}$ that is charged pumped beyond the sensor array voltage supply levels Multi-Output Pixel FIG. 21 illustrates an embodiment of a pixel array subsection 390 populated by nine multi-output pixels 400. As shown in detail view 395, each multi-output pixel 400 includes not one, but three source follower transistors ("SFb," "SFy," and "SFx") coupled to a floating diffusion node ("FD") to generate respective, matching outputs corresponding to the charge level of the floating diffusion node. More specifically, source-follower SFb within each of the pixels 400 drives a voltage to maintain a constant current (in proportion to the floating diffusion charge level) onto a shared output line 402, thus contributing to an averaged or "binned" output representative of the average of the charge levels in the 9-pixel subsection 390 when all three rows of pixels are concurrently read-out. By contrast, 'y' source-followers SFy within the pixels 400 of a given column are coupled to a respective column line 404 to enable an individual pixel output per column when a single row of pixels is read-out, and 'x' source followers SFx within the pixels 400 of a given row are similarly coupled to a respective row output line 406 to enable an individual pixel output per row when a single column of pixels is read-out.

The transfer gate (TX), reset transistor (RG) and photodiode (PD) are interconnected within pixel 400 as generally described above, while the single transfer-enable transistor shown in FIG. 1 (i.e., transistor 103) is replaced with transistors TS and TC coupled in a staged configuration. More specifically, transistor TS couples row signal Txr_sparse to the gate terminal of transistor TC when column signal Txc_sparse is asserted, and transistor TC performs the transfer-enable function, coupling row signal TGr to transfer gate TX when a logic high Txr_sparse signal is asserted at the TC gate node (i.e., when node "m_sparse" is high). By this arrangement, an averaged or binned readout is effected by concurrently raising Tgr, Txr_sparse and Txc_sparse, then dropping Txc_sparse to a low potential to disable the PD to FD charge transfer. To effect a serial pixel readout, the floating diffusion and m_sparse are enabled, with serial data being read continuously via row and column pixout lines 406 and 404 and corresponding row and column comparators as discussed below. Note that the TGr of the rows of sparse data pixels can be asserted continuously without interfering with the parallel data read operation so long as care is taken to occasionally refresh the m_sparse node and reset the floating diffusion of the sparse flagged pixels at a time that doesn't interfere with the parallel data read or shutter pointer (i.e., x, y pixel selection).

Figure 22:
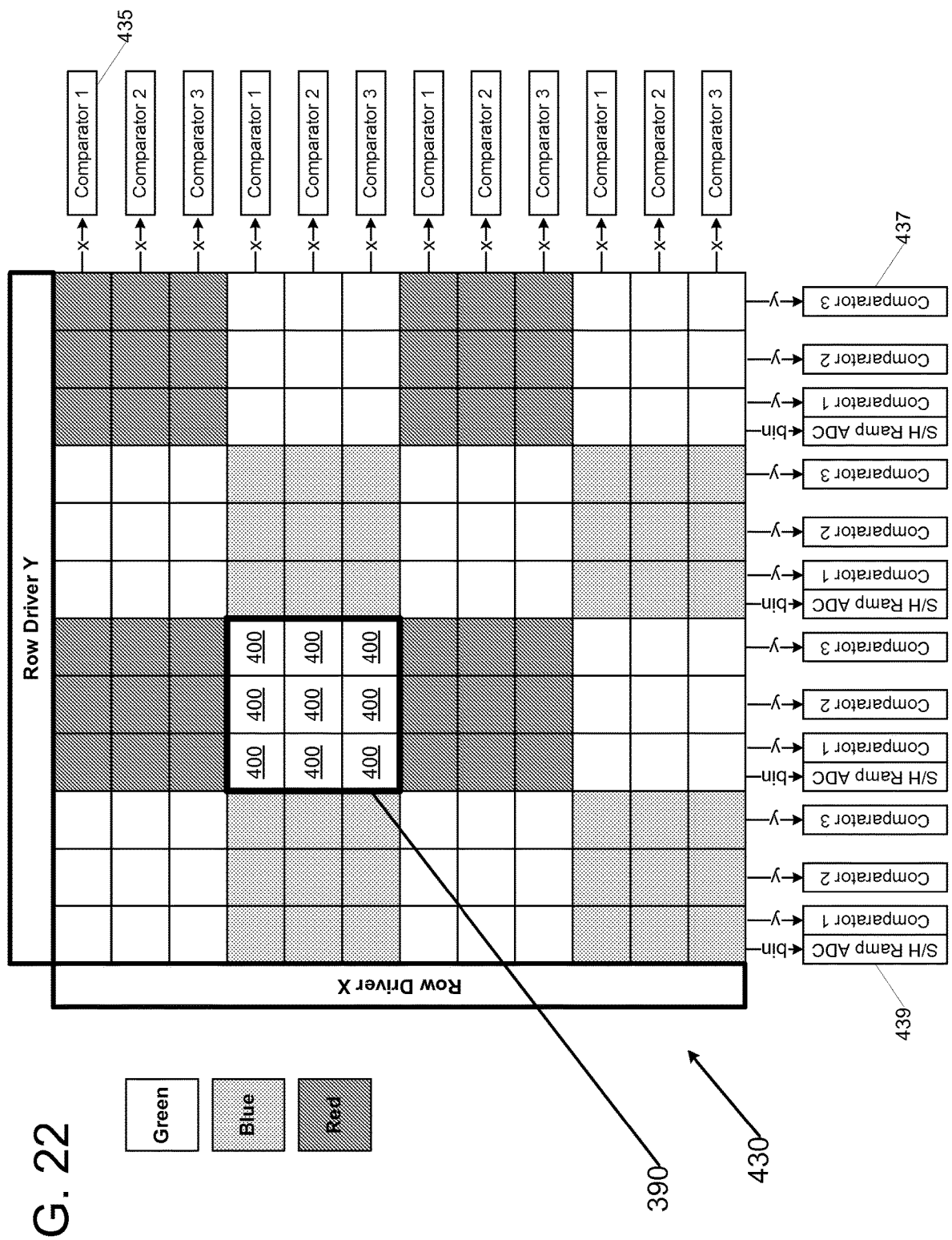
FIG. 22 illustrates an exemplary imaging device architecture having an array of 3×3 pixel kernels coupled to row and column-based "row drivers" and overlaid by a Bayer-patterned color filter array with kernel-resolution.

FIG. 22 illustrates an exemplary imaging device architecture 430 having an array of 3×3 pixel kernels 390 (showing only sixteen kernels 390 and thus 144 pixels 400 in this example) coupled to row and column-based "row drivers" (i.e., "Row Driver X" and "Row Driver Y") and overlaid by a Bayer-patterned color filter array (CFA) with kernel-resolution (i.e., each color filter element corresponds to a respective 3×3 pixel kernel so that a given kernel may be referred to as a "red," "green," or "blue" kernel). As shown, each of the row outputs "x" (corresponding to a "Pixout x" line in FIG. 21) is coupled to a respective row comparator 435, and each of the column outputs "y" (corresponding to a "Pixout y" line in FIG. 21) is coupled to a respective column comparator 437, thereby enabling simultaneous high-speed row and column compare operations.

The 3×3 binned output "bin" (corresponding to a "Pixout bin" line in FIG. 21) for each column of kernels is coupled to a respective sample-and-hold/ADC circuit 439. By this arrangement, respective binned-readouts may be generated for the 3×3 pixel kernels of a respective row (i.e., selected set of three pixel rows) may be generated concurrently with serial read-out operation of the high-speed row and column comparators.

Concurrent-Readout Stacked Sensor Architecture

Readout architecture and pixel array partitioning can be an important element of an image sensor, particularly in implementations having a large number of small pixels such as "binary pixels" or "jots" which yield a binary output result (i.e., small, often sub-diffraction-limit pixels from which a logic '1' or logic '0' output is derived according to whether a photon strike or threshold number of photon strikes have occurred with respect to the binary pixel's photodetector).

FIG. 23 illustrates an exemplary two-die implementation of an image sensor 500 (e.g., having binary pixels or multi-bit pixels) in which a pixel array die 501 is stacked on a "preprocessor" die 503. As shown in top views 502t and 504t, pixel array die 501 includes a plurality of image pixel (IP) "row groups" 507 (i.e., adjacent rows of pixels) and row control circuitry 509, while preprocessor die 503 includes a plurality of readout blocks 517, one for each IP row group 507) together with readout control circuitry 519 and physical signaling interface (PHY) 521. In the depicted implementation, each readout block 517 includes a readout circuit for the corresponding IP row group 507 (i.e., "Read Circuit Group 0," "Read Circuit Group 1," etc.) and corresponding A and B memory groups to store accumulated binary or multi-bit results read out from pixels of the corresponding IP row group (i.e., "Memory Group 0A"/"Memory Group 0B," "Memory Group 1A"/"Memory Group 1B," etc.). Referring to cross-sectional view 502x, pixel array die 501 may be mounted to the preprocessor die 503 in a flip-chip orientation to permit backside illumination of the IP row groups and with the backside of the pixel array die covered, for example, by a color filter array 530 and/or microlens array 532. The front-side of pixel array die 501 and preprocessor die 503 each include respective metal layers (and/or other conductive layers) to effect wiring interconnections (i.e., 534 and 542, respectively) with respect to on-die elements and die-to-die interconnects (depicted as a micro-ball array disposed between dies 501 and 503, though any practical die-to-die or wafer-to-wafer interconnect structures may be used). As the exemplary cross-sectional view illustrates, the readout circuits and A/B memory groups may be disposed directly beneath their corresponding IP row groups to minimize or otherwise reduce signal interconnect lengths and routing complexity (e.g., possibly reducing the number of metal layers needed with respect to either or both dies).

FIG. 24 illustrates an exemplary readout profile within the image sensor of FIG. 23, demonstrating a readout parallelism achieved by provision of a separate readout circuit for each IP row group. That is, in the exemplary embodiment of FIG. 23 having four IP row groups and corresponding readout circuits (more or fewer IP row groups/readout circuits may be provided) each quartile of the pixel rows (i.e., N/4 IP rows, where N is the total number of IP rows in the image sensor) is readout in parallel, with a rolling shutter for each. Thus, pixel rows 0, N/4, N/2 and 3N/4 are readout in parallel (i.e., concurrently), followed by parallel readout of pixel rows 1, (N/4)+1, (N/2)+1, (3N/4)+1 and so forth.

One potential consequence of the multiple parallel readout channels with respect to spatially offset pixel rows (i.e., where, in effect, Q separate and distinct arrays are readout in parallel with a rolling shutter within each as shown in FIG. 24) is an anomalous rolling shutter artifact. For example, moving objects within a scene may yield jagged edges within an output image due to the temporal discontinuity from the last pixel row readout from the $i^{th}$ IP row group to the first pixel row readout from the $i+1^{th}$ IP row group.

Figure 27:
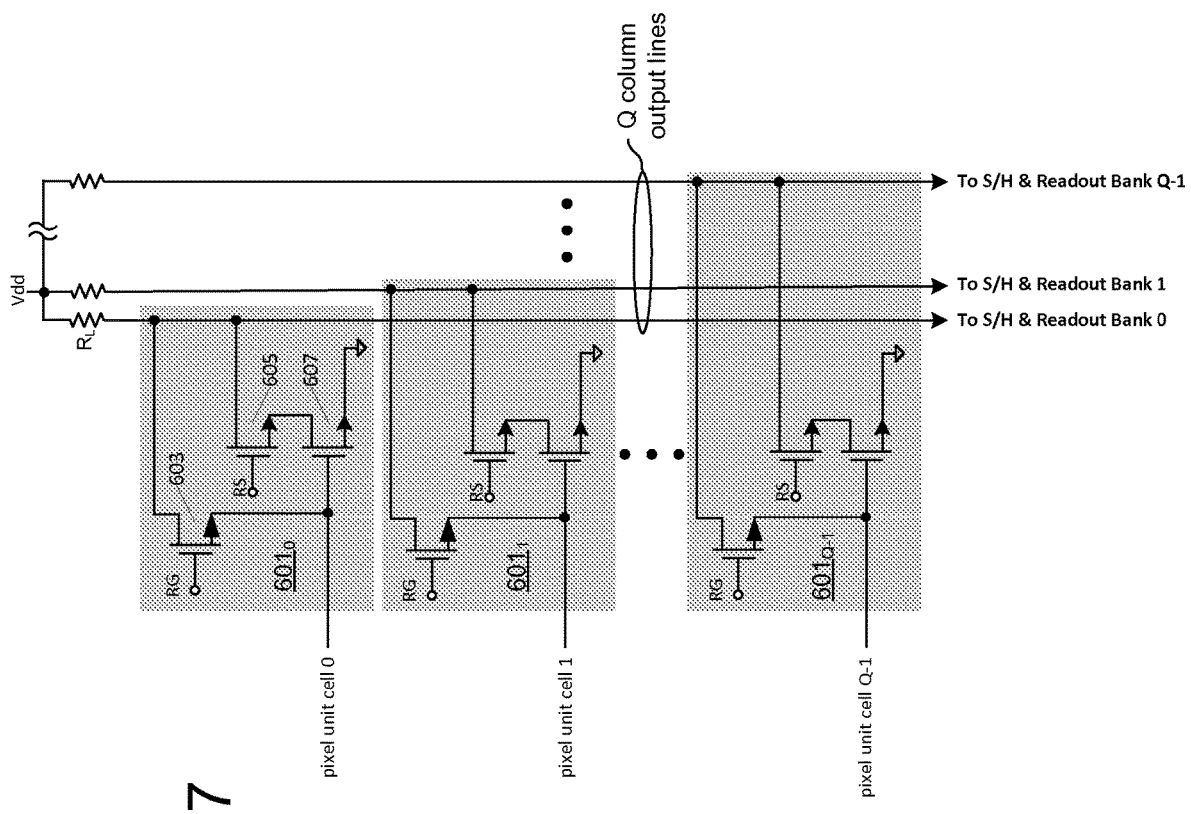
FIG. 27 illustrates a more detailed embodiment of pixel control circuitry and multiple associated column output lines that may be used to implement pixel control circuitry and column outputs within the image sensor of FIG. 25.

FIGS. 25-27 illustrate an embodiment of an image sensor 570 that avoids such anomalous rolling shutter readout artifacts without sacrificing readout parallelism. As shown with respect to pixel array die 571, instead of grouping physically adjacent IP rows into readout groups with associated readout circuitry, IP row groups are interleaved within pixel array 573 on a row-by-row basis (i.e., "row interleaved") so that every set of 'Q' adjacent pixel rows includes a pixel row from a respective one of Q pixel groups. By this arrangement, implemented at least in part within row control circuitry 575, Q adjacent pixel rows may be readout concurrently (or simultaneously), followed by a progression (or "roll") to the next set of Q pixel rows, until the entire frame is readout. The resulting rolling shutter readout profile is shown in FIG. 26, in an example where 'N' is the total number of pixel rows within array 573 and Q=4 (higher or lower values of Q may be used).

Row-interleaved readout parallelism may be implemented, for example, by providing Q column output lines (or wires) per pixel column as shown in detail view 574 of FIG. 25, with each column output line being coupled to a respective readout circuit. In the particular embodiment shown, the column output lines are implemented in the middle of three wafers within a wafer stack (or middle of three dies within the die stack yielded by wafer dicing as discussed below), which can be a deeply scaled CMOS technology with sufficient levels of metal to accommodate multiple column output lines per pixel column.

FIG. 27 illustrates a more detailed embodiment of pixel control circuitry and multiple associated column output lines that may be used to implement pixel control circuitry and column outputs within the image sensor of FIG. 25. As shown, a respective pixel control circuit $601_0$-$601_{Q-1}$ is provided for each of Q row-adjacent pixel unit cells (i.e., floating diffusion coupled via one or more transfer gates to respective photodiodes) and includes a reset transistor 603 controlled by reset-gate signal RG, a read-select transistor 605 controlled by read-select signal RS, and an in-pixel amplification transistor 607 coupled to the floating diffusion node of the corresponding pixel unit cell. In the particular embodiment shown, reset transistor 603 serves to reset the floating diffusion node (FD) and photodiodes (PD) of the corresponding pixel unit cell (i.e., by switchably coupling the FD and/or PDs to Vdd or other supply voltage node via per-column pull-up resistance $R_L$ (i.e., a pull-up load that may be implemented by active and/or passive components). During pixel readout, read-select transistor 605 is switched on (i.e., by assertion of read-select signal, RS) to switchably couple the drain terminal of in-pixel amplification transistor to the corresponding one of Q column output lines. The source terminal of the in-pixel amplification element is coupled to a ground reference node (or other common voltage node) to establish a common source amplification circuit in which the signal level generated on the corresponding column output line is inversely proportional to the floating diffusion potential ($V_{FD}$—the potential applied at the gate of the in-pixel amplification transistor) and thus proportional to the photocharge transferred from a given photodiode to the floating diffusion node during pixel sampling. The signal levels thus generated on the Q column output lines concurrently by the Q pixel control circuits $6010$-$601Q$-1 is received within respective sample-and-hold (S/H) and readout banks for conversion into respective single-bit or multi-bit digital pixel values. Note that various other amplification arrangements (e.g., source-follower) may be used to generate the column output signal in alternative embodiments. Also, correlated double sampling may be used to cancel or mitigate noise at the electrically-isolated floating diffusion node.

Referring again to FIG. 25, an exemplary three-die stack implementation of image sensor 570 (or three-wafer stack) is shown in detail view 580. In the embodiment shown, a sensor die 581 is flip-chip mounted to a pixel control die 582 ("circuit die 582"), which is itself stacked on a memory, logic and output die 583 ("circuit die 573"). As discussed above, a color filter array (CFA) layer 584, and/or microlens layer 585 may be stacked over the backside of the sensor die.

Sensor die 581 includes the photodetector array 587 (i.e., array of pixel unit cells, including photodiodes or other photosensitive elements and corresponding transfer gates and floating diffusion nodes, interconnected as generally discussed above by detector array wiring 589) bounded by row decoder/driver circuitry and sensor I/O timing circuitry (and interconnect pads for that circuitry) 588a and 588b. Pixel control die 582 includes an array of row-interleaved pixel control circuits 591 as shown in FIG. 27 (e.g., field-effect transistors, FETs, interconnected by FET array wiring 595) for the N groups of pixel unit cells, each of which is coupled via flip-chip interconnect (shown generally by per unit-cell pixel-control interconnects 592) to a respective pixel unit cell within sensor die 581.

Still referring to pixel control die 582, pixel control circuits 591 are bounded by sample-and-hold (S/H) banks and corresponding readout circuitry (comparators and/or ADCs) 593a and 593b, which are themselves coupled to the circuit wiring (594a/594b) of the sensor I/O timing circuitry via row and pad-level interconnects ("Row & Pad Level"). The readout circuitry within pixel control die 582 is also coupled via "bank channels" to memory, logic and output die 583 which includes memory, logic and output circuitry 597 (and associated wiring 598) to accumulate pixel readout results (i.e., for temporal oversampling) and output finalized pixel values to downstream processing circuitry. In one embodiment, for example, each S/H and readout bank 593a/593b contains per column S/H capacitors and switches, sense amplifier and two memory elements per pixel column. In one implementation, for example, there are at least Q S/H and readout banks corresponding to the Q column output lines. The results of a pixel row readout of the pixel array (i.e., circuitry split between the photodetector array and pixel control FETs) may be transferred from the first line memory to the second line memory, and then from the second line memory to a processing block, memory and physical signaling interface (PHY). The Q bank channels may be associated with respective sets of offset pixel rows i, i+Q, i+2Q, etc. rather than a block of adjacent pixels rows and may be implemented by various types of chip-to-chip interconnects. In one embodiment, for example, the bank channels between the two circuit wafers 582 and 583 are implemented by low-pitch through-silicon-vias (e.g. pad level TSVs). The output "pads" of die 583 constitute the Q digital bank outputs (i.e., one for each row-interleaved image pixel group) and the final m-bit per pixel digital output.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, pixel array sizes, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

The section headings in the above detailed description have been provided for convenience of reference only and in no way define, limit, construe or describe the scope or extent of the corresponding sections or any of the embodiments presented herein. Also, various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit image sensor comprising:
    a photodiode having a pinning layer;
    a floating diffusion node;
    a transfer gate disposed between the floating diffusion node and the photodiode, adjacent to the pinning layer of the photodiode;
    a first control input coupled to the transfer gate;
    a second control input coupled to the pinning layer of the photodiode to enable a depletion potential of the photodiode to be raised and lowered; and
    readout circuitry to;
        determine whether accumulated photocharge within the photodiode exceeds a threshold;
        assert a first control pulse on the first control input during a readout interval to enable transfer of the accumulated photocharge from the photodiode to the floating diffusion node; and
        if the accumulated photocharge is determined not to exceed the threshold, assert a second control pulse on the second control input, concurrently with assertion of the first control pulse, to prevent the transfer of the accumulated photocharge otherwise enabled by assertion of the first control pulse.

2. The integrated-circuit image sensor of claim 1 wherein the first control input is coupled to a row control line within the integrated-circuit image sensor and the second control input is coupled to a column control line within the integrated-circuit image sensor, the row and column control lines extending orthogonally with respect to each other.

3. The integrated-circuit image sensor of claim 1 further comprising:
    a substrate in which the photodiode and the floating diffusion node are formed; and
    a doped region of a first conductivity type disposed within the substrate in electrical contact with the pinning layer of the photodiode, and wherein the second control input is coupled to the pinning layer of the photodiode through the doped region.

4. The integrated-circuit image sensor of claim 1 further comprising a substrate region in which the photodiode and the floating diffusion node are formed and wherein the pinning layer of the photodiode is electrically isolated from the substrate region.

5. The integrated-circuit image sensor of claim 4 wherein the pinning layer is electrically isolated from a pinning layer of an adjacent pixel of the integrated-circuit image sensor.

6. The integrated-circuit image sensor of claim 1 wherein the readout circuitry to determine whether accumulated photocharge within the photodiode exceeds a threshold comprises circuitry to assert a third control pulse on the first control input during the readout interval prior to assertion of the first control pulse, the third control pulse having a lower pulse amplitude than the first control pulse.

7. The integrated-circuit image sensor of claim 1 wherein the accumulated photocharge within the photodiode is accumulated over an exposure interval that precedes assertion of the first control pulse on the first control input and wherein the readout circuitry comprises circuitry to maintain the first control input at a ground potential during the exposure interval and to maintain the second control input at a potential more negative than the ground potential during the exposure interval.

8. The integrated-circuit image sensor of claim 7 wherein the readout circuitry to assert the second control pulse if the accumulated photocharge is determined not to exceed the threshold comprises circuitry to temporarily raise the potential of the second control input to the ground potential to effect the second control pulse.

9. The integrated-circuit image sensor of claim 1 wherein, if the accumulated photocharge is determined to exceed the threshold, the readout circuitry refrains from asserting the second control pulse so that the accumulated photocharge is transferred from the photodiode to the floating diffusion node upon assertion of the first control pulse, the readout circuitry further comprising a transistor biased in a source-follower configuration to generate a readout signal on a column output line, the readout signal having a voltage according to the accumulated photocharge transferred to the floating diffusion node.

10. The integrated-circuit image sensor of claim 1 wherein the readout circuitry to determine whether accumulated photocharge within the photodiode exceeds a threshold comprises circuitry to assert a third control pulse on the first control input during the readout interval prior to assertion of the first control pulse, the third control pulse having a lower pulse amplitude than the first control pulse such that, if the accumulated photocharge exceeds the threshold, a portion of the accumulated photocharge is transferred from the photodiode to the floating diffusion node to produce a readout signal having a voltage level indicating that the accumulated photocharge exceeds the threshold.

11. A method of operation within an integrated-circuit image sensor having a pixel array, the method comprising:
determining whether accumulated photocharge within a photodiode of a pixel within the pixel array exceeds a threshold;
asserting a first control pulse on a row control line during a readout interval to enable transfer of the accumulated photocharge from the photodiode to a floating diffusion node of the pixel; and
if the accumulated photocharge is determined not to exceed the threshold, asserting a second control pulse on a pinning-layer control line coupled to a pinning layer of the photodiode concurrently with assertion of the first control pulse to prevent the transfer of the accumulated photocharge otherwise enabled by assertion of the first control pulse.

12. The method of claim 11 wherein the pinning-layer control line and the row control line extend across the pixel array perpendicularly to one another.

13. The method of claim 11 wherein the photodiode and floating diffusion node are formed in a substrate and wherein the pinning-layer control line is coupled to the pinning layer of the photodiode via a doped region disposed within the substrate in electrical contact with the pinning layer.

14. The method of claim 13 wherein the pinning layer of the photodiode is electrically isolated from a pinning layer of a photodiode of a neighboring pixel.

15. The method of claim 11 wherein determining whether accumulated photocharge within the photodiode exceeds the threshold comprises asserting a third control pulse on the row control line during the readout interval prior to assertion of the first control pulse, the third control pulse having a lower pulse amplitude than the first control pulse.

16. The method of claim 11 further comprising maintaining the row control line at a ground potential during an exposure interval in which the accumulated photocharge is accumulated within the photodiode and maintaining the pinning-layer control line at a potential more negative than the ground potential during the exposure interval.

17. The method of claim 16 wherein asserting the second control pulse if the accumulated photocharge is determined not to exceed the threshold comprises temporarily raising the potential of the pinning-layer control line to the ground potential.

18. The method of claim 11 further comprising:
refraining from asserting the second control pulse if the accumulated photocharge is determined to exceed the threshold such that the accumulated photocharge is transferred from the photodiode to the floating diffusion node upon assertion of the first control pulse; and
generating a readout signal on a column output line, the readout signal having a voltage according to the accumulated photocharge transferred to the floating diffusion node.

19. The method of claim 11 wherein determining whether the accumulated photocharge exceeds the threshold comprises asserting a third control pulse on the row control line during the readout interval prior to assertion of the first control pulse, the third control pulse having a lower pulse amplitude than the first control pulse such that, if the accumulated photocharge exceeds the threshold, a portion of the accumulated photocharge is transferred from the photodiode to the floating diffusion node to produce a readout signal having a voltage level indicating that the accumulated photocharge exceeds the threshold.

20. An integrated-circuit image sensor comprising:
a photodiode having a pinning layer;
a floating diffusion node;
a transfer gate disposed between the floating diffusion node and the photodiode, adjacent to the pinning layer of the photodiode;
a first control input coupled to the transfer gate;
a second control input coupled to the pinning layer of the photodiode to enable a depletion potential of the photodiode to be raised and lowered; and
means for:
determining whether accumulated photocharge within the photodiode exceeds a threshold;
asserting a first control pulse on the first control input during a readout interval to enable transfer of the accumulated photocharge from the photodiode to the floating diffusion node; and
if the accumulated photocharge is determined not to exceed the threshold, asserting a second control pulse on the second control input, concurrently with assertion of the first control pulse, to prevent the transfer of the accumulated photocharge otherwise enabled by assertion of the first control pulse.

\* \* \* \* \*